United States Patent
Kawashima

(10) Patent No.: US 9,377,677 B2
(45) Date of Patent: Jun. 28, 2016

(54) GENERATING METHOD, CREATING METHOD, EXPOSURE METHOD, AND STORAGE MEDIUM

(75) Inventor: Miyoko Kawashima, Haga-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1124 days.

(21) Appl. No.: 12/850,967

(22) Filed: Aug. 5, 2010

(65) Prior Publication Data

US 2011/0032499 A1 Feb. 10, 2011

(30) Foreign Application Priority Data

Aug. 10, 2009 (JP) ................................ 2009-186149
Jul. 13, 2010 (JP) ................................ 2010-159167

(51) Int. Cl.
*G03B 27/42* (2006.01)
*G03F 7/20* (2006.01)

(52) U.S. Cl.
CPC ............... *G03B 27/42* (2013.01); *G03F 7/705* (2013.01); *G03F 7/70433* (2013.01); *G03F 7/70466* (2013.01)

(58) Field of Classification Search
CPC . G03B 27/42; G03F 7/70433; G03F 7/70466; G03F 7/705; G03F 1/144; G03F 1/36; G11C 29/83
USPC ............ 355/30, 46, 52, 53, 55, 72-77; 430/5, 430/22, 311, 322; 708/191, 403; 716/50, 53
See application file for complete search history.

(56) References Cited

U.S. PATENT DOCUMENTS

| | | | |
|---|---|---|---|
| 5,563,012 A | 10/1996 | Neisser | |
| 6,553,562 B2 | 4/2003 | Capodieci et al. | |
| 7,493,589 B2 | 2/2009 | Socha | |
| 7,547,502 B2 | 6/2009 | Kawashima | |
| 7,592,130 B2 | 9/2009 | Kawashima | |
| 2005/0275820 A1* | 12/2005 | Fukuhara et al. | 355/69 |
| 2007/0184390 A1* | 8/2007 | Kawashima | 430/311 |
| 2007/0273854 A1* | 11/2007 | Nagasaka | 355/46 |
| 2008/0052334 A1 | 2/2008 | Yamazoe | |
| 2008/0106714 A1* | 5/2008 | Okita | 355/53 |
| 2009/0074287 A1* | 3/2009 | Kawashima | 382/144 |
| 2009/0148783 A1 | 6/2009 | Socha | |

FOREIGN PATENT DOCUMENTS

| | | |
|---|---|---|
| JP | 2002-287324 A | 10/2002 |
| JP | 2005-276852 A | 10/2005 |
| JP | 2007-109969 A | 4/2007 |
| JP | 2007-123333 A | 5/2007 |
| JP | 2007-183630 A | 7/2007 |
| JP | 2008-040470 A | 2/2008 |

* cited by examiner

*Primary Examiner* — Toan Ton
*Assistant Examiner* — Mona M Sanei
(74) *Attorney, Agent, or Firm* — Canon USA, Inc. IP Division

(57) ABSTRACT

The present invention provides a method of generating, by a computer, data on patterns of a plurality of originals for use in multiple exposure, in which a single-layer pattern is formed on a substrate by exposing the substrate a plurality of times, in an exposure apparatus including an illumination optical system which illuminates an original with light from a light source, and a projection optical system which projects a pattern of the original onto a substrate.

8 Claims, 26 Drawing Sheets

F I G. 2A
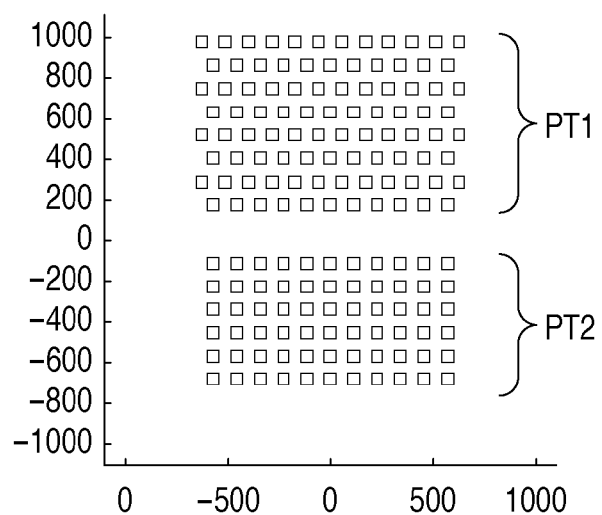
F I G. 2B
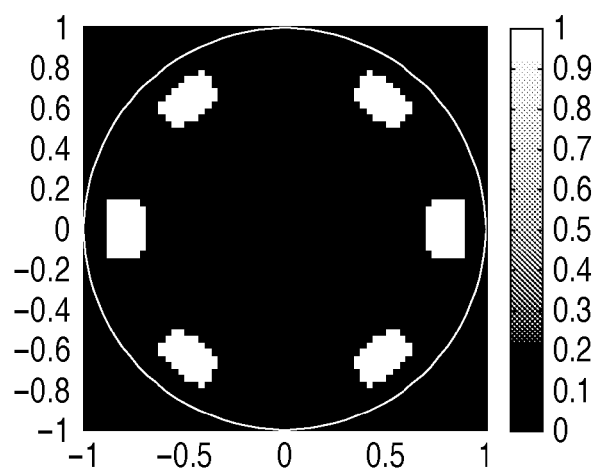
F I G. 2C
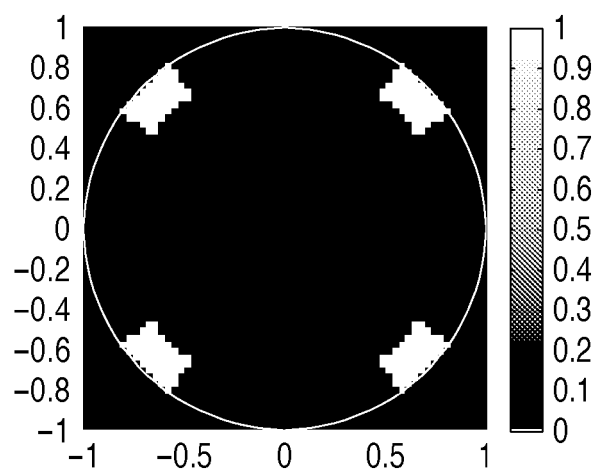

F I G. 12
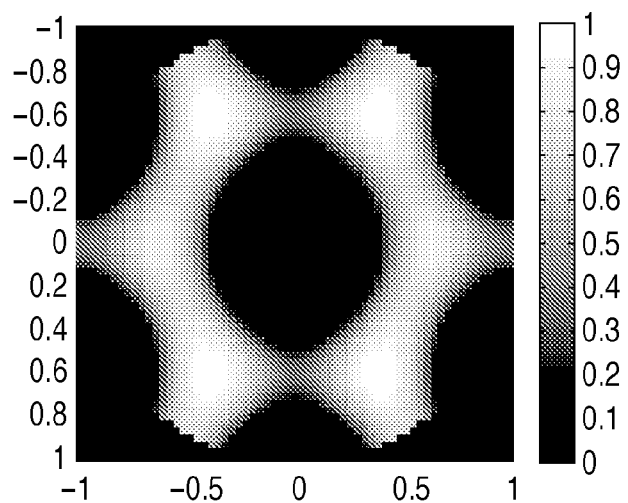
F I G. 13A
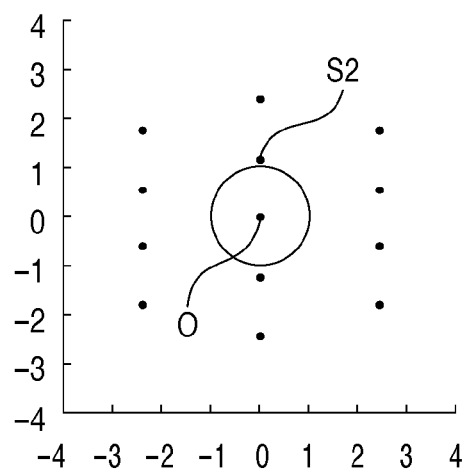
F I G. 13B
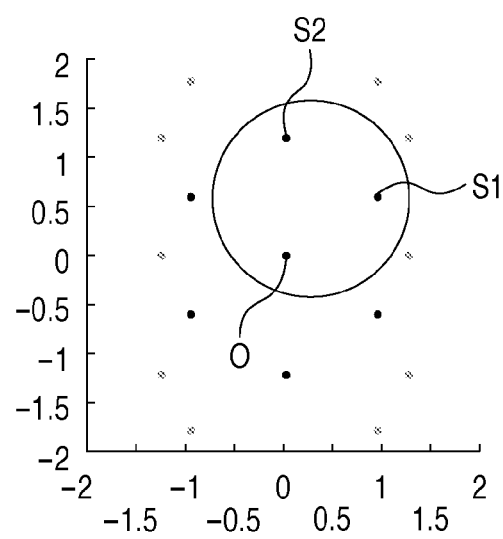

F I G. 15
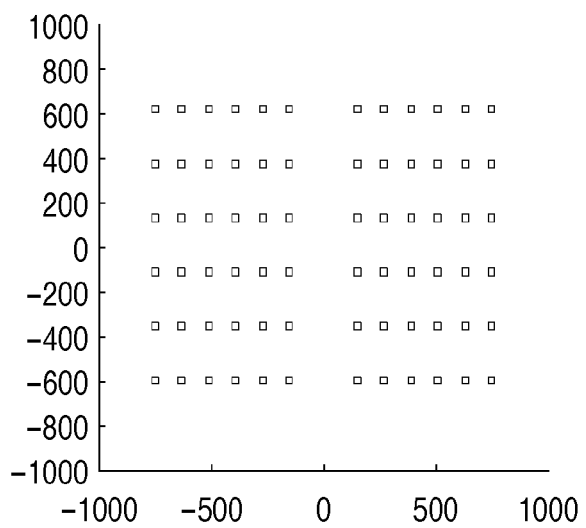
F I G. 16A
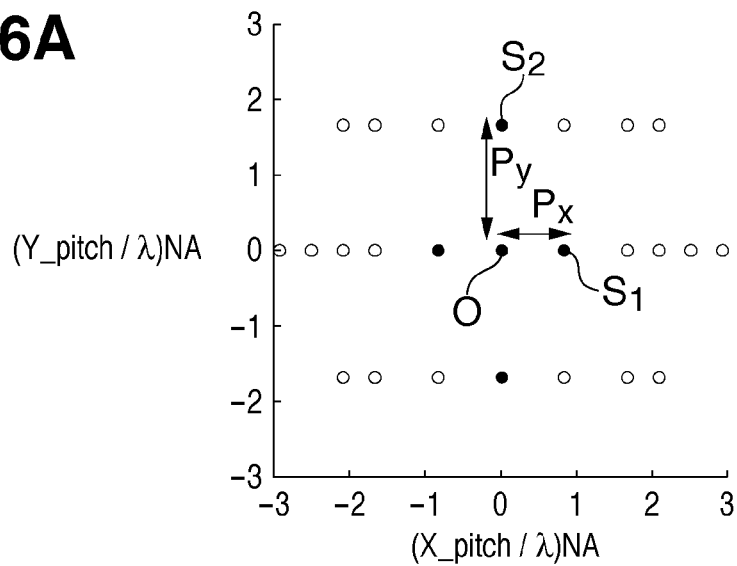
F I G. 16B
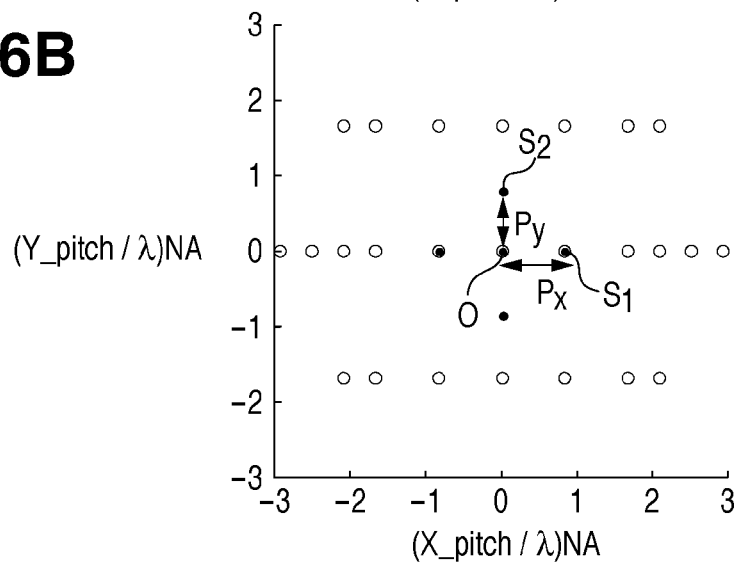

F I G. 20A
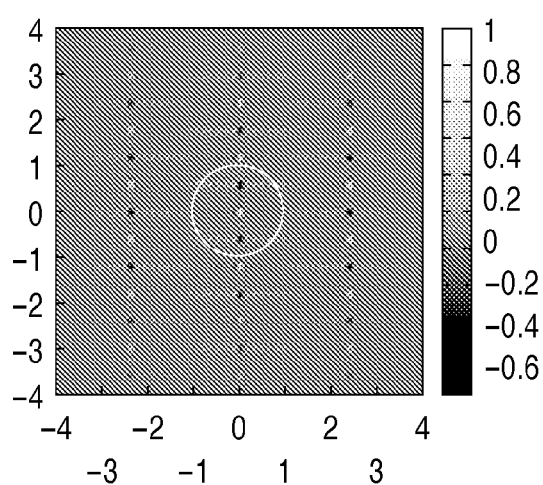
F I G. 20B
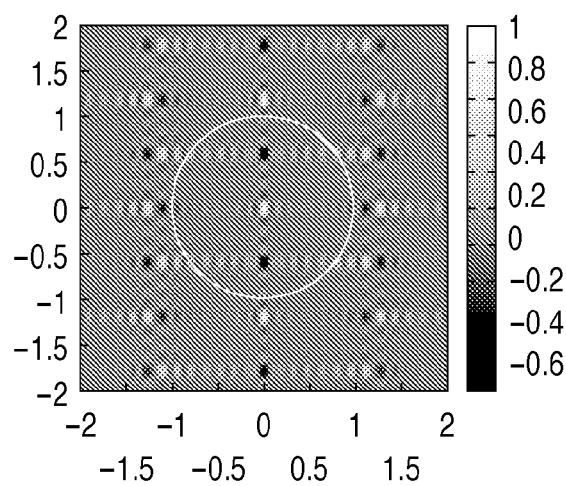
F I G. 20C
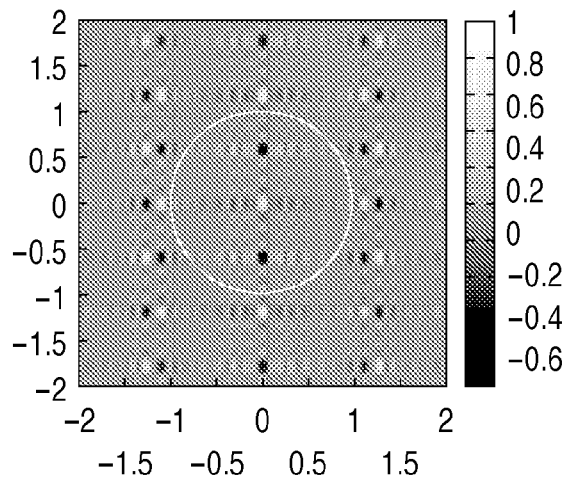

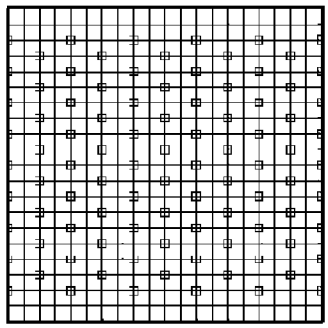
FIG. 25A
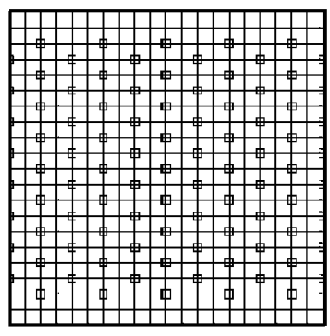
FIG. 25C
FIG. 25E
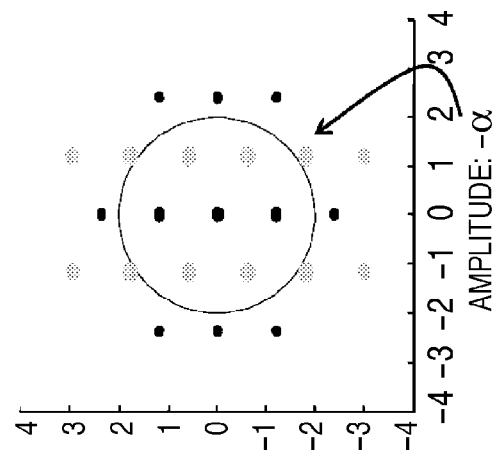
FIG. 25B
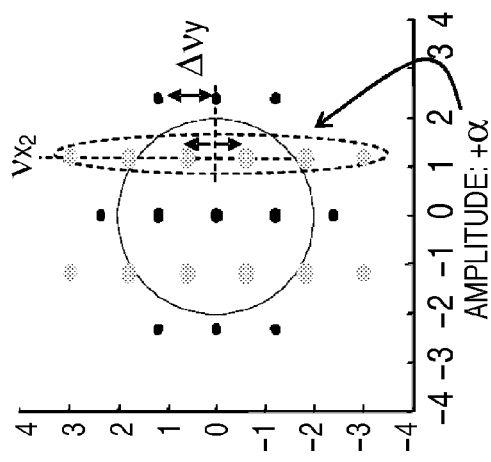
FIG. 25D
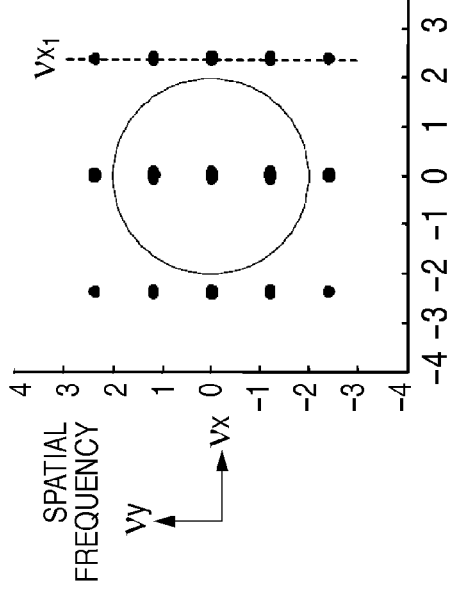
FIG. 25F

US 9,377,677 B2

GENERATING METHOD, CREATING METHOD, EXPOSURE METHOD, AND STORAGE MEDIUM

BACKGROUND OF THE INVENTION

1. Field of the Invention

The present invention relates to a generating method, a creating method, an exposure method, and a storage medium.

2. Description of the Related Art

An exposure apparatus is employed to fabricate semiconductor devices such as a semiconductor memory and a logic circuit using photolithography. The exposure apparatus projects and transfers a pattern formed on an original (a mask or a reticle) onto a substrate such as a wafer by a projection optical system. In recent years, along with advances in micro-patterning of semiconductor devices, it has become difficult for an exposure apparatus to transfer (resolve) patterns fine enough to fabricate these devices.

Under the circumstance, so-called multiple exposure is adopted in which a pattern to be formed on a substrate (that is, a geometric pattern corresponding to circuit elements to be integrated on a substrate) is divided into a plurality of patterns, and the divided patterns are transferred by exposure at different times (see U.S. Pat. No. 5,563,012). For example, a double exposure technique called double patterning (DPT) divides a pattern into two patterns, and performs exposure using two masks on which the respective divided patterns are formed. At this time, a pattern is divided such that all pattern elements which form patterns on the respective masks are sufficiently spaced from each other, that is, these intervals between them, which allow the respective pattern elements to individually resolve.

Such a double exposure technique is generally used when a plurality of pattern elements which form a pattern are populated too densely to resolve as individual pattern elements. Note that rule- and model-based decomposition techniques have been proposed to divide a pattern to be formed on a substrate (see U.S. Pat. No. 6,553,562 and Japanese Patent Laid-Open Nos. 2002-287324, 2005-276852, and 2007-183630).

However, the rule-based decomposition techniques require a large number of rules in order to handle complex circuit design. The rule-based decomposition techniques can perform decomposition using a rule set established in advance in order to divide the pattern. Nevertheless, actual circuit design often requires intervention of the user (operator) when a pattern to be formed on a substrate has so complex a two-dimensional geometry that there are patterns (pattern elements) which do not comply with the rules.

The model-based decomposition techniques also suffer from various kinds of problems. For example, the model-based decomposition techniques require a long time to complete the pattern division process. Furthermore, the model-based decomposition techniques often require intervention of the user (operator) because they also suffer from a problem that the pattern cannot be divided depending on circumstances involved.

Also, it is a common practice to use the same illumination condition (effective source) for a plurality of divided patterns without attaching importance to the illumination condition in pattern division. For example, the model-based decomposition techniques generally use a fixed illumination condition for imaging computation. Thus, the model-based decomposition techniques often cannot be used to divide a pattern, such as a pattern in which pattern elements (for example, contact holes) are two-dimensionally arranged. This is because a pattern cannot be resolved by inappropriate illumination condition.

U.S. Pat. No. 6,553,562 discloses a method of dividing a line pattern into a vertical pattern and a horizontal pattern, and using dipole illumination patterns before and after rotation through 90° as the illumination conditions for the respective divided patterns. However, in this case, the illumination condition is merely rotated through 90°, so the illumination conditions before and after the rotation have similar shapes. Also, when pattern division in which adjacent pattern elements are thinned out (that is, the minimum pitch between pattern elements is doubled) is performed instead of dividing the pattern in accordance with its direction, quadrupole illumination or annular illumination is often assumed as the illumination condition, as in Japanese Patent Laid-Open Nos. 2002-287324, 2005-276852, and 2007-183630. In this case as well, identical or similar illumination conditions are used for the respective divided patterns.

SUMMARY OF THE INVENTION

The present invention provides a technique advantageous to generate data on the patterns of a plurality of originals for use in multiple exposure.

According to one aspect of the present invention, there is provided a method of generating, by a computer, data on patterns of a plurality of originals for use in multiple exposure, in which a single-layer pattern is formed on a substrate by exposing the substrate a plurality of times, in an exposure apparatus including an illumination optical system which illuminates an original with light from a light source, and a projection optical system which projects a pattern of the original onto a substrate, the method including a first step of generating a map by sequentially defining as a pattern element of interest a plurality of pattern elements which form a temporary target pattern corresponding to a pattern to be formed on the substrate, and mapping positions of pattern elements other than the pattern element of interest relative to the pattern element of interest using a position of the pattern element of interest as an origin, a second step of selecting pattern elements with a periodicity from the map generated in the first step, and determining an effective source corresponding to an array pattern of the selected pattern elements among a plurality of predetermined effective sources, a third step of postulating a pupil filter which forms a transmittance distribution, according to which the pupil filter transmits light from a region with an intensity value larger than a predetermined value in the effective source determined in the second step, on a pupil plane of the projection optical system, a fourth step of calculating an intensity distribution formed on an image plane of the projection optical system by the light having passed through a temporary target pattern, placed on an object plane of the projection optical system, and the pupil filter, assumed in the third step, when the effective source determined in the second step illuminates the temporary target pattern, a fifth step of specifying a peak position where an intensity has a peak in the intensity distribution calculated in the fourth step, a sixth step of extracting a first pattern element which includes the peak position, specified in the fifth step, from the plurality of pattern elements when the temporary target pattern is projected onto the image plane of the projection optical system, and a seventh step of generating data on a pattern including the first pattern element extracted in the sixth step as data on a pattern of one original of the plurality of originals, wherein a cycle including the first step to the seventh step is repeated using a pattern including a second pattern element obtained by excluding the first pattern element from the plurality of pattern elements as a new temporary target pattern, and the repetition is ended in a round of the cycle, in which the number of second pattern elements becomes zero.

Further features of the present invention will become apparent from the following description of exemplary embodiments with reference to the attached drawings.

BRIEF DESCRIPTION OF THE DRAWINGS

FIGS. 2A to 2C are views for conceptually explaining a mask data generating method according to the present invention.

FIGS. 10A to 10E are views for explaining mask data generation in the second embodiment.

FIG. 12 is a view for explaining the mask data generation in the second embodiment.

FIGS. 13A and 13B are views for explaining the mask data generation in the second embodiment.

FIG. 15 is a view for explaining the mask data generation in the second embodiment.

FIGS. 16A and 16B are views for explaining the mask data generation in the second embodiment.

FIGS. 20A to 20C are views for explaining the mask data generation in the second embodiment.

FIGS. 25A to 25F are views for explaining a mask data generation in the fourth embodiment.

DESCRIPTION OF THE EMBODIMENTS

Figure 1:
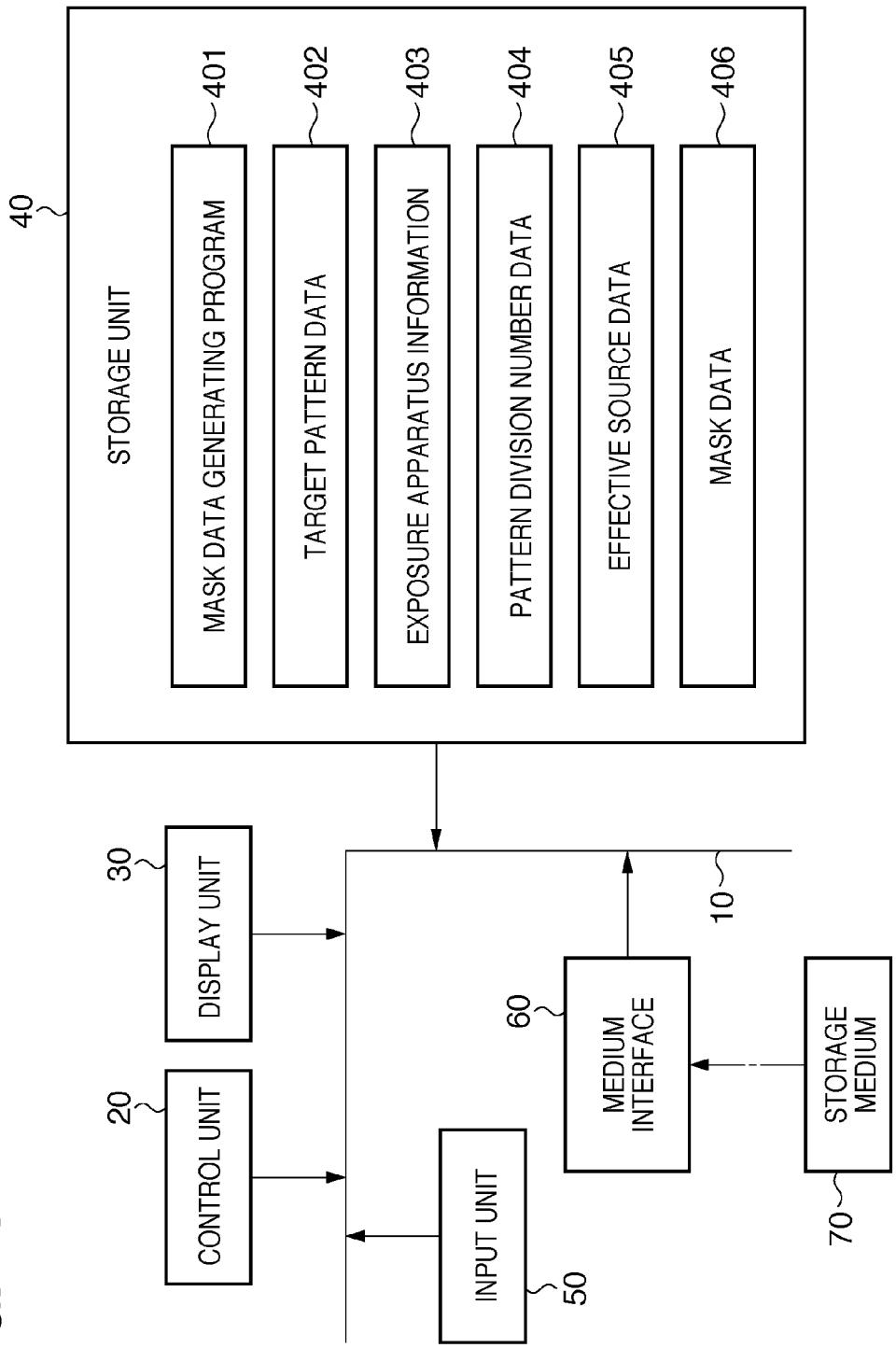
FIG. 1 is a schematic block diagram showing the configuration of a processing apparatus which executes a generating method according to one aspect of the present invention.

Preferred embodiments of the present invention will be described below with reference to the accompanying drawings. Note that the same reference numerals denote the same members throughout the drawings, and a repetitive description thereof will not be given.

The present invention is applicable to fabrication of various types of devices, for example, semiconductor chips such as an IC and an LSI, display devices such as a liquid crystal panel, detection devices such as a magnetic head, and image sensing devices such as a CCD, and generation of data on the pattern of an original for use in micromechanics. The micromechanics means herein a technique of creating a high-performance mechanical system on the order of microns by applying a semiconductor integrated circuit fabrication technique to fabrication of microstructures, or the mechanical system created by such a technique. The present invention is suitable to generation of data on the pattern of an original used in, for example, an exposure apparatus, which includes a projection optical system with a high numerical aperture (NA) and an immersion exposure apparatus in which the space between a projection optical system and a wafer is filled with a liquid.

FIG. 1 is a schematic block diagram showing the configuration of a processing apparatus 1 which executes a generating method according to one aspect of the present invention. The generating method generates data (mask data) on the patterns of a plurality of originals for use in multiple exposure in an exposure apparatus including an illumination optical system which illuminates an original (mask) with light from a light source, and a projection optical system which projects the pattern of the original onto a substrate. The multiple exposure means herein a technique of performing exposure a plurality of times using a plurality of originals to form all patterns corresponding to the respective originals on a substrate in a single layer. Also, the multiple exposure implies techniques in which development processes or etching processes are either performed or not performed in the intervals between successive exposure processes.

The processing apparatus 1 is, for example, a general-purpose computer. The processing apparatus 1 includes a bus line 10, control unit 20, display unit 30, storage unit 40, input unit 50, and medium interface 60, as shown in FIG. 1. The bus line 10 connects the control unit 20, display unit 30, storage unit 40, input unit 50, and medium interface 60 to each other.

The control unit 20 is, for example, a CPU, a GPU, a DSP, or a microcomputer, and includes a cache memory or another memory for temporary storage. The control unit 20 starts up and executes, a mask data generating program 401 stored in the storage unit 40, based on a startup command for the mask data generating program 401, which is input by the user via the input unit 50. The control unit 20 performs an arithmetic operation, associated with mask data generation, using the data stored in the storage unit 40.

The display unit 30 is, for example, a display device such as a CRT display or a liquid crystal display. The display unit 30 displays, for example, information associated with execution of the mask data generating program 401 (for example, effective source data 405 and mask data 406 (both will be described later)).

The storage unit 40 is, for example, a memory or a hard disk. The storage unit 40 stores the mask data generating program 401 provided from a storage medium 70 connected to the medium interface 60. The storage unit 40 also stores target pattern data 402 and exposure apparatus information 403 as pieces of input information prior to the execution of the mask data generating program 401. The storage unit 40 moreover stores pattern division number data 404, the effective source data 405, and the mask data 406 as pieces of output information after the execution of the mask data generating program 401. The storage unit 40 can also store, for example, an aerial image as information temporarily stored during the execution of the mask data generating program 401.

The mask data generating program 401 is a program for generating the mask data 406 indicating data on the patterns of a plurality of masks for use in multiple exposure. Note that the patterns each are formed from closed figures and a set of these figures constitute the entire mask pattern.

The target pattern data 402 is data on a pattern (which is a pattern to be formed on a substrate such as a wafer and is called a layout pattern or a target pattern) laid out in designing, for example, an integrated circuit. The target pattern data 402 is input information for determining the pattern of a mask and, in this embodiment, is often data temporarily stored to divide the target pattern data 402 into a plurality of pattern data.

The exposure apparatus information 403 includes, for example, NA information, $\lambda$ information, aberration information, and resist information. The NA information is information concerning the numerical aperture (NA) of the projection optical system on the image plane side. The $\lambda$ information is information concerning the wavelength $\lambda$ of light (exposure light) emitted by the light source. The aberration information is information concerning the aberration of the projection optical system. If the projection optical system has birefringence, the aberration information also includes information concerning a phase shift generated in accordance with the birefringence. The resist information is information concerning a resist applied on a wafer.

The pattern division number data 404 is data which is generated by executing the mask data generating program 401, and indicates the number of division of the target pattern data 402 into a plurality of pattern data.

The effective source data 405 is data which is generated by executing the mask data generating program 401, and is associated with effective sources corresponding to the plurality of pattern data obtained by dividing the target pattern data 402. Note that the effective source means a light intensity distribution formed on the pupil plane of the projection optical system of the exposure apparatus.

The mask data 406 is data which is used to create a mask by drawing a pattern on a substrate with, for example, chromium (Cr), and indicates a final mask pattern generated by executing the mask data generating program 401. In this embodiment, the mask data 406 includes a plurality of pattern data obtained by dividing the target pattern data 402.

Note that the target pattern data 402 and mask data 406 include, for example, the positions, sizes, shapes, transmittances, and phase information of pattern elements which form a pattern to be formed on a substrate. The target pattern data 402 and mask data 406 also include, for example, the transmittance and phase information of a region (background) where no pattern elements are present.

The input unit 50 includes, for example, input devices such as a keyboard and a mouse. The user can input, for example, pieces of information associated with the mask data generating program 401 via the input unit 50.

The medium interface 60 includes, for example, a flexible disk drive, CD-ROM drive, DVD-ROM drive, and USB interface, and can be connected to the storage medium 70. The storage medium 70 is, for example, a flexible disk, a CD-ROM, a DVD-ROM, or a USB memory, and provides the mask data generating program 401 and other programs to be executed by the processing apparatus 1.

A mask data generating method in this embodiment will be conceptually explained herein. As a target pattern to be formed on a substrate, an array pattern is assumed in which pattern elements (more specifically, contact holes) are two-dimensionally arranged, and which is a dense pattern including a period that cannot be resolved by one exposure, as shown in FIG. 2A. However, the target pattern may partially include sparsely arranged pattern elements (contact holes).

First, as shown in FIG. 2A, the target pattern will be considered by roughly classifying it into a first pattern PT1 and a second pattern PT2. The first pattern PT1 has pattern elements arranged such that those in one row shift from those in an adjacent row by a half pitch (that is, in a staggered pattern). The second pattern PT2 has pattern elements arranged such that those in one row have the same pitch as those in an adjacent row. However, although pattern elements in both the first pattern PT1 and second pattern PT2 have the same pitch at horizontal direction, an illumination condition suitable for resolving the first pattern PT1 is not the same as that suitable for resolving the second pattern PT2.

In a certain pattern element in the first pattern PT1, six pattern elements surround the pattern element. A six-pole effective source, as shown in FIG. 2B, is known to be suited to such an array pattern.

Figure 3A:
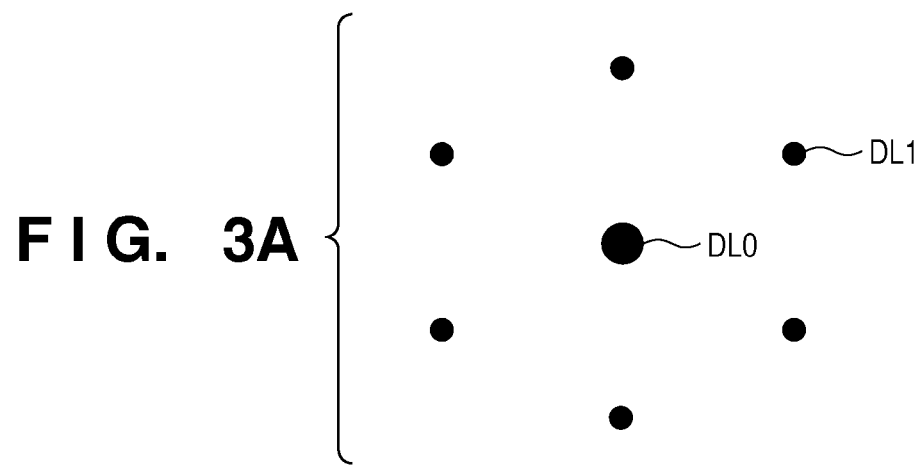
FIGS. 3A to 3C are views for conceptually explaining the mask data generating method according to the present invention.

FIG. 3A shows light beam diffracted by the first pattern PT1 (light beams diffracted by pattern elements which form the first pattern PT1). Referring to FIG. 3A, six 1st- and higher-order diffracted lights DL1 surround a 0th-order diffracted light DL0. When the first pattern PT1 is illuminated using appropriate hexapole illumination, three diffracted lights, including the 0th-order diffracted light DL0, of the diffracted light shown in FIG. 3A enter the pupil of the projection optical system, and form an image by interfering with each other.

Upon defining a certain pattern element in the second pattern PT2 as a pattern element, four pattern elements surround the pattern element. A quadrupole illumination, as shown in FIG. 2C, is known to be suited to such an array pattern.

Figure 3B:
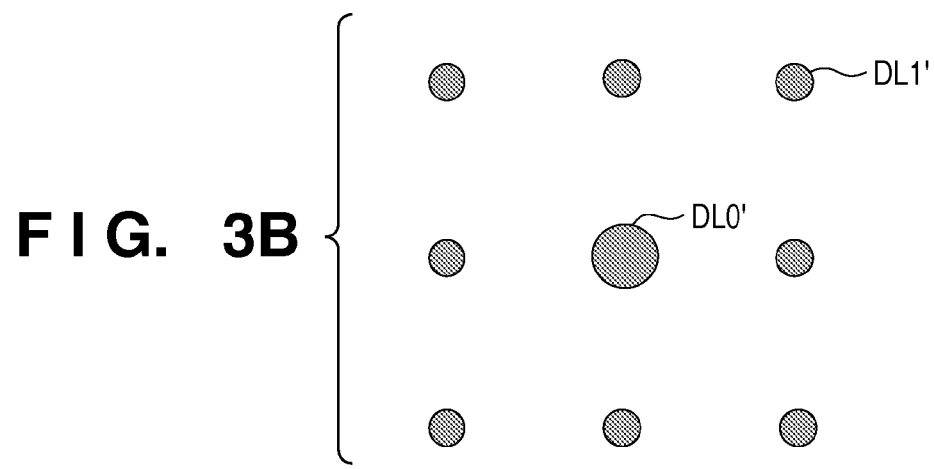

FIG. 3B shows light beam diffracted by the second pattern PT2 (light beams diffracted by pattern elements which form the second pattern PT2). Referring to FIG. 3B, eight 1st- and higher-order diffracted lights DL1' surround a 0th-order diffracted light DL0'. When the second pattern PT2 is illuminated using appropriate quadrupole illumination, four diffracted lights, including the 0th-order diffracted light DL0', of the diffracted light shown in FIG. 3B enter the pupil of the projection optical system, and form an image by interfering with each other.

When pattern elements are two-dimensionally arranged, large differences occur in imaging performance by different illumination conditions. This is because an optimum illumination condition differs depending on the type of array pattern, as described earlier. Thus, there must be an array pattern suited to that illumination condition.

In view of this, in this embodiment, a pattern is divided using a method of fixing an illumination condition, and selecting an array pattern suited to that illumination condition. When an array pattern suited to the initial illumination condition is excluded from the target pattern, the remaining pattern generally is an array pattern suited to an illumination condition different from the initial illumination condition. An illumination condition different from the initial illumination condition is then set for the remaining pattern, and an array pattern suited to that illumination condition is selected. Such a process is repeated until the number of pattern element becomes zero.

Note that an array pattern suited to an illumination condition may be absent, or the number of pattern elements included in an array pattern may be small, depending on the illumination condition set. In such cases, the number of divided pattern is relatively large. Also, if pattern pitch is less than the resolution, it needs to be divided into two or more patterns, so setting of an illumination condition is of prime importance.

Also, in this embodiment, a virtual transmittance distribution is formed on the pupil plane of the projection optical system by introducing the concept of a pupil filter. Note that the pupil filter is used only for computation in which an aerial image formed on the pupil plane of the projection optical system is calculated, and is not used for actual exposure. When a pupil filter is assumed so as to form a transmittance distribution nearly equal to the intensity distribution of an illumination condition, only an array pattern suited to that illumination condition resolves, while other array patterns do not resolve. Hence, an aerial image is calculated based on all or some elements of the target pattern, the illumination condition, and the pupil filter, and only pattern elements with strong coherency are selected. In other words, an array pattern suited to an illumination condition can be selected by selecting only pattern elements which have high intensities in an aerial image.

Figure 4:
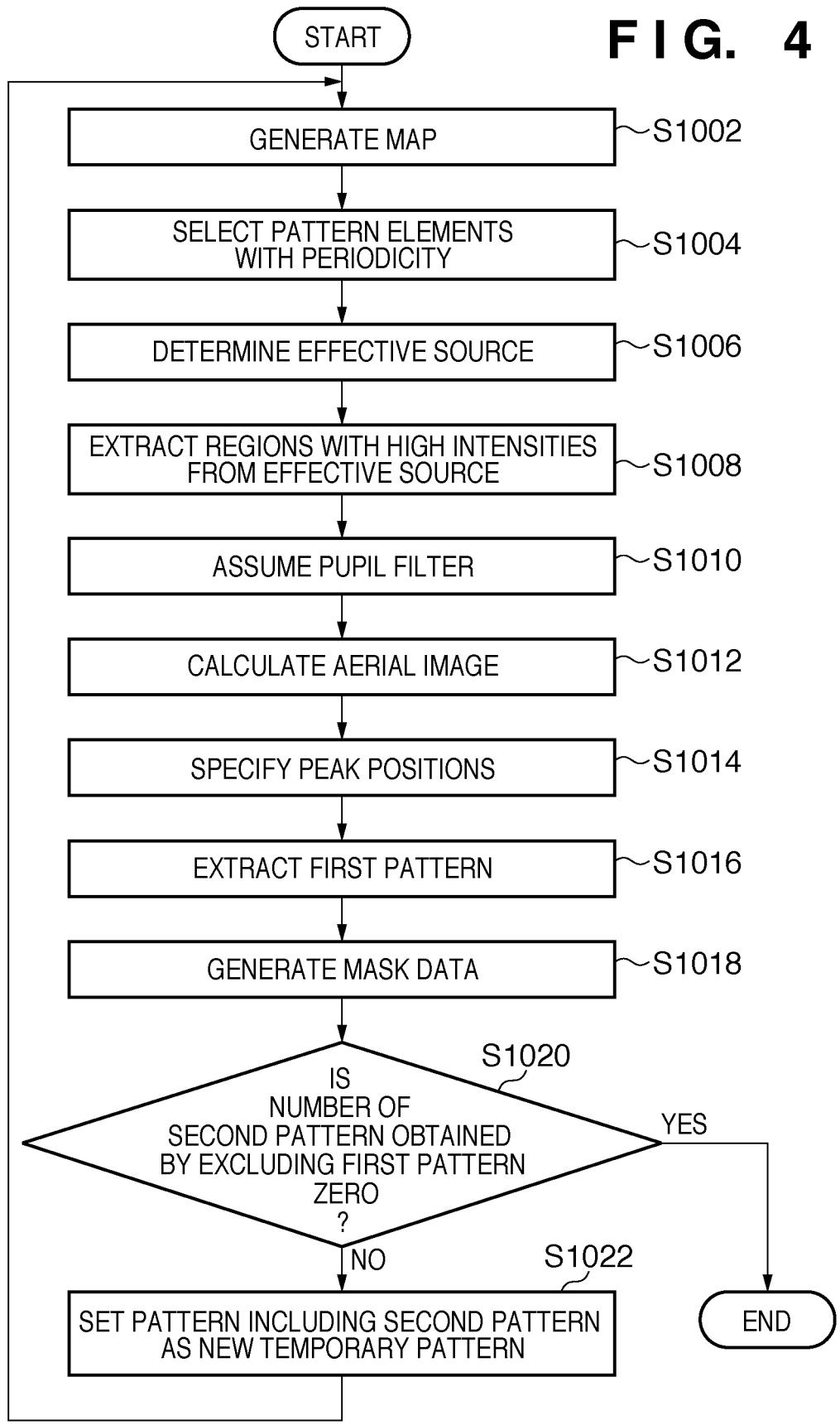
FIG. 4 is a flowchart for explaining a process of generating mask data by executing a mask data generating program by a control unit of the processing apparatus shown in FIG. 1.

A process of generating the mask data 406 by executing the mask data generating program 401 by the control unit 20 of the processing apparatus 1 will be explained below with reference to FIG. 4. Note that pieces of input information such as the target pattern data 402 and exposure apparatus information 403 are determined in advance by the user. The user can select the pieces of input information stored in the storage unit 40, or can directly input the pieces of input information via the input unit 50.

In step S1002 (first step), a map indicating the relative positional relationship among a plurality of pattern elements which form a temporary target pattern is generated. The target pattern data is set to a temporary target pattern. More specifically, a map is generated by sequentially defining as a pattern element 1 the plurality of pattern elements which form the temporary target pattern, and mapping the relative positions (directions and distances) to the position of the pattern element 2 of one of pattern elements other than the pattern element 1. In other words, in step S1002, the array direction and distance distributions of the plurality of pattern elements which form the temporary target pattern are extracted.

In step S1004 (second step), pattern elements with a periodicity are selected from the map generated in step S1002. For example, pattern elements with a pitch which brings about three-beam interference (an array pattern in which six pattern elements surround one pattern element), or pattern elements with a pitch which brings about four-beam interference (an array pattern in which eight pattern elements surround one pattern element) are selected, as described above.

In step S1006, an effective source suited to the array pattern of the pattern elements selected in step S1004 is determined. More specifically, an effective source corresponding to the array pattern of the pattern elements selected in step S1004 is determined among a plurality of predetermined effective sources. However, all techniques known to those skilled in the art are applicable to the determination of an effective source for array of pattern elements.

In step S1008, regions with high intensities (that is, regions with strong coherency) are extracted from the effective source determined in step S1006. More specifically, regions with intensity values larger than a predetermined value are extracted from the effective source determined in step S1006.

In step S1010 (third step), a pupil filter which forms a transmittance distribution on the pupil plane of the projection optical system is assumed. More specifically, regions with intensity values larger than a predetermined value are extracted from the effective source determined in step S1006. Although a transmittance distribution formed by a pupil filter need not be exactly equal to the distribution of regions with high intensities in an effective source distribution, the process can be simplified by equalizing them.

In step S1012 (fourth step), an intensity distribution (aerial image) formed on the image plane of the projection optical system is calculated. More specifically, the effective source determined in step S1006 illuminates the temporary target pattern which is placed on the object plane of the projection optical system, and the light is passed through the pupil filter assumed in step S1010, and an intensity distribution formed on the image plane of the projection optical system is calculated. The intensity distribution (aerial image) can be calculated using, for example, coherency among pattern elements based on, for example, 2D-TCC disclosed in Japanese Patent Laid-Open No. 2008-040470.

In step S1014 (fifth step), peak positions of the intensity distribution calculated in step S1012 are specified. If the mask pattern is a light-shielding pattern, positions where the intensity is lower than a threshold and has local minimum values are specified as peak positions. If the mask pattern is a transparent pattern, positions where the intensity is higher than a threshold and has local maximum values are specified as peak positions.

In step S1016 (sixth step), pattern elements (first pattern elements) which include the peak positions specified in step S1014 are extracted from the plurality of pattern elements which form the temporary target pattern. Although only pattern elements which include the peak positions are extracted in this embodiment, pattern elements near the peak positions may be extracted in addition to the former pattern elements.

In step S1018 (seventh step), data on a pattern including the pattern elements (first pattern) extracted in step S1016 is generated as mask pattern data (first mask data). Note that the mask data generating program 401 is a program for generating mask data of a plurality of masks for use in multiple exposure, as described earlier. Thus, the mask data generated in step S1018 is mask data of one of a plurality of masks for use in multiple exposure.

In step S1020, it is determined whether the number of pattern elements (second pattern) obtained by excluding the pattern elements (first pattern) extracted in step S1016 is zero. If the number of second pattern is zero, the process of generating the mask data 406 ends. If the number of the second pattern is not zero, the process advances to step S1022.

In step S1022, the second pattern is set as a new temporary target pattern, and the process returns to step S1002. A cycle including the first to seventh steps is repeated, and the repetition is stopped in a round of the cycle, when the number of the second pattern is zero.

In device fabrication, an increase of the number of grouping pattern (mask) becomes a higher cost. Nevertheless, the number of grouping pattern is sometimes reduced by partially changing (correcting) the initial target pattern. In this case, a warning may be issued to the user (operator) as the number of grouping pattern exceeds a predetermined number (for example, 2).

Mask data generated by executing a mask data generating program will be described in detail below in the first, second, and third embodiments. Note that a projection optical system is assumed to have an image-side numerical aperture of 1.35, and exposure light is assumed to have a wavelength of 193 nm. Note also that the projection optical system is assumed to have no aberration, and the characteristics of a resist applied on a wafer are not taken into consideration. The half pitch HP (nm) of the pattern of a mask is normalized using the image-side numerical aperture NA of the projection optical system and the wavelength λ (nm) of the exposure light as: k1=HP (nm)/(λ (nm)/NA).

First Embodiment

As a target pattern, an array pattern is assumed in which pattern elements are two-dimensionally arranged, and the minimum half pitch HP is 57 (nm), as shown in FIG. 2A. In other words, the half pitch of the target pattern is k1=57 (nm)/(193 (nm)/1.35)=0.4. The target pattern shown in FIG. 2A has pattern elements arrayed at the same pitch in both the vertical and horizontal directions, and includes a first pattern PT1 and second pattern PT2, as described earlier. Note that in FIG. 2A, the ordinate and abscissa indicate the dimensions (nm) corresponding to the scale on the image plane of the projection optical system, and correspond to the X- and Y-axes, respectively, hereinafter.

Light diffracted by a target pattern including two array patterns (first pattern PT1 and second pattern PT2) with different periodicities will be described herein. Light beams diffracted by the first pattern PT1 and the second pattern PT2 have been described above with reference to FIGS. 3A and 3B. Thus, a diffracted light distribution generated by the target pattern is a distribution obtained by superposing the diffracted light distributions shown in FIGS. 3A and 3B on each other, as shown in FIG. 3C.

Figure 3C:
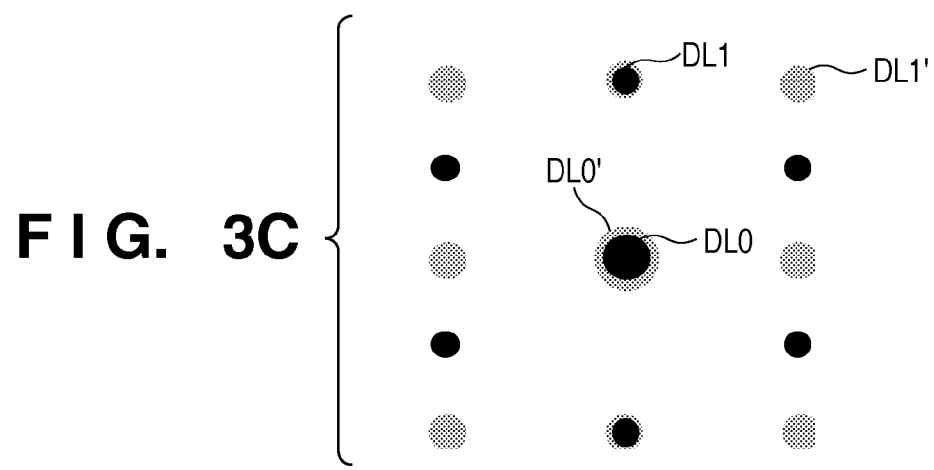

In this embodiment, division of a target pattern means dividing diffracted lights with different periodicities in a diffracted light distribution formed by light diffracted by the target pattern (that is, means dividing the diffracted light distribution shown in FIG. 3C into those shown in FIGS. 3A and 3C). In other words, the pattern pitch is divided into sets of frequencies which are easy to resolve in the frequency space.

Figure 5A:
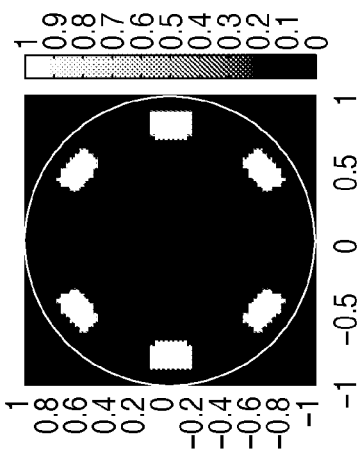
FIGS. 5A to 5F are views for explaining mask data generation in the first embodiment.

Mask data generated by executing a mask data generating program for the target pattern shown in FIG. 2A will be described in detail below. First, a map shown in FIG. 5A is generated as a map indicating the relative positional relationship among a plurality of pattern elements which form a temporary target pattern corresponding to the target pattern shown in FIG. 2A. In the map shown in FIG. 5A, circles indicate the positions (central positions) of pattern elements to map the relative positional relationship among the pattern elements. Note that in FIG. 5A, the ordinate and abscissa indicate the dimensions obtained by normalizing, those (nm) corresponding to the scale on the image plane of the projection optical system, using (λ (nm)/NA). In the map shown in FIG. 5A, the relative positional relationship among elements of the pattern PT1 and PT2 are superposed on each other.

Pattern elements necessary to determine an effective source (that is, pattern PT1 with a periodicity) are extracted from the map shown in FIG. 5A. For example, in the map shown in FIG. 5A, attention is paid to pattern elements surrounding the origin, and a minimum number of pattern elements which have periods in the directions of straight lines that connect these pattern elements and the origin, and also have distances from the origin, that are equal to the pitch, are extracted. In this case, seven pattern elements (indicated by black dots in FIG. 5A) which form an array pattern that causes three light beams diffracted by the pattern elements to interfere with each other are extracted. Japanese Patent Laid-Open Nos. 2007-109969 and 2007-123333, for example, disclose the conditions under which three light beams diffracted by a periodic pattern interfere with each other.

Next, an effective source corresponding to the array pattern of the pattern elements (black dots) extracted from the map shown in FIG. 5A is determined. An effective source can be obtained as, for example, an effective source that causes three light beams diffracted by a pattern including the pattern elements (black dots) extracted from the map shown in FIG. 5A to interfere with each other.

An effective source can also be obtained from a diffracted light distribution. First, a diffracted light distribution (see FIG. 3C) formed by light diffracted by a temporary target pattern corresponding to the target pattern is obtained. The pupil position is then relatively moved so that three diffracted lights (one 0th-order diffracted light and two 1st-order diffracted lights) enter the pupil by taking account of the pupil size in the diffracted light distribution, thereby determining the position of the 0th-order diffracted light within the pupil as the position of a light source.

Figure 6A:
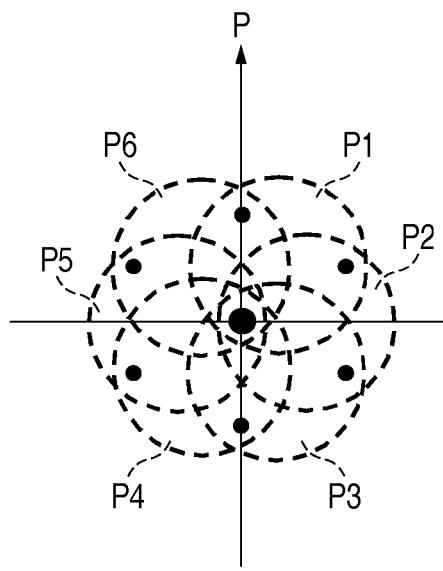
FIGS. 6A to 6D are views for explaining the mask data generation in the first embodiment.
Figure 6B:
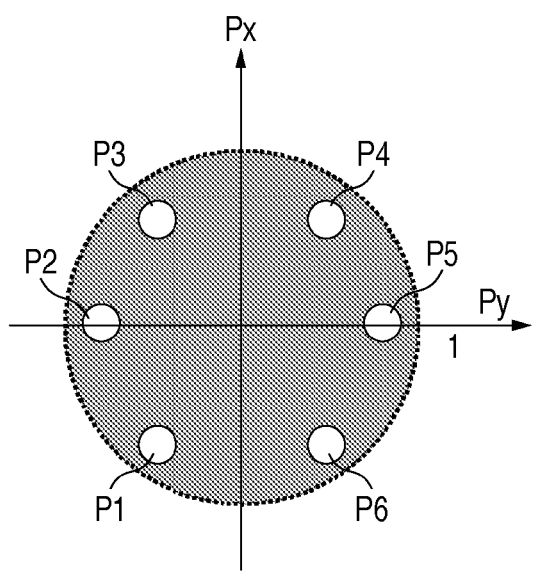

FIG. 6A is a view showing the relationship between the diffracted light and the pupil position. In FIG. 6A, the pupil positions are indicated by circles representing pupils with a radius of 1, and three diffracted lights enter the pupil when the pupil position lies at each of P1, P2, P3, P4, P5, and P6. FIG. 6B shows the positions of 0th-order diffracted lights within the pupils as the positions of light sources. The positions of 0th-order diffracted lights when the pupil position lies at P1, P2, P3, P4, P5, and P6 are indicated by open circles, and light sources which transmit the light beams are set using the open circles as centers.

A case in which pattern elements form an array pattern that causes four light beams diffracted by the pattern elements to interfere with each other in the map shown in FIG. 5A will also be considered. In this case, the pupil position is relatively moved so that four diffracted lights (one 0th-order diffracted light and three 1st-order diffracted lights) enter the pupil in a diffracted light distribution formed by light diffracted by a temporary target pattern corresponding to the target pattern, thereby determining the position of the 0th-order diffracted light within the pupil as the position of a light source.

Figure 6C:
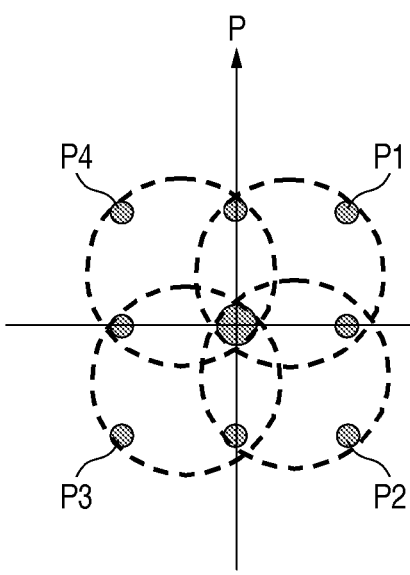
Figure 6D:
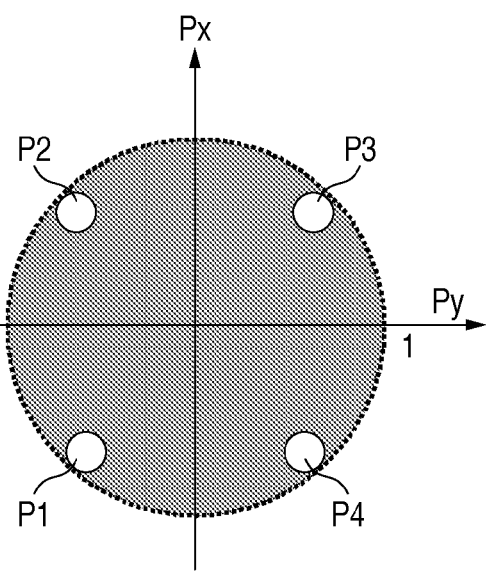

FIG. 6C is a view showing the relationship between the diffracted light and the pupil position. In FIG. 6C, the pupil positions are indicated by circles representing pupils with a radius of 1, and four diffracted lights enter the pupil when the pupil position lies at each of P1, P2, P3, and P4. FIG. 6D shows the positions of 0th-order diffracted lights within the pupils as the positions of light sources. The positions of 0th-order diffracted lights when the pupil position lies at P1, P2, P3, and P4 are indicated by open circles, and light sources which transmit the light beams are set using the open circles as centers.

Figure 5B:
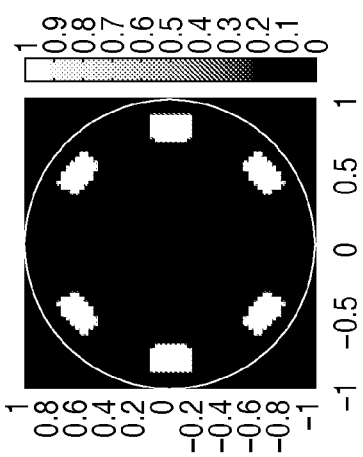
Figure 5C:
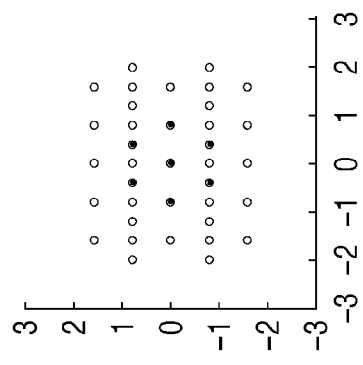

Next, regions with high intensities are extracted, as shown in FIG. 5B, from the first effective source. FIG. 5B shows regions with high intensities as the effective source (intensity distribution) on the pupil plane. A pupil filter which forms a transmittance distribution, according to the regions extracted from the effective source is assumed, as shown in FIG. 5C (that is, a transmittance distribution of pupil filter corresponds to the intensity distribution shown in FIG. 5B). Note that the effective source (intensity distribution) shown in FIG. 5B and the pupil filter transmittance distribution shown in FIG. 5C are defined in a pupil coordinate system assuming the pupil radius as 1.

Figure 5D:
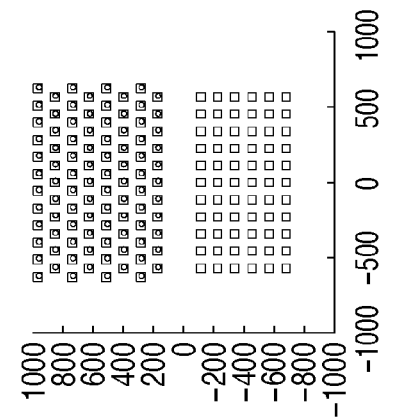

An intensity distribution (aerial image) formed on the image plane is calculated using the target pattern shown in FIG. 2A, the effective source shown in FIG. 5B, and the pupil filter shown in FIG. 5C. As shown in FIG. 5D, the diffracted light relatively tilted upon oblique incidence is transmitted through the pupil in accordance with the transmittance distribution formed on the pupil plane, and forms an image on the image plane. In the effective source shown in FIG. 5B, diffracted lights obliquely enter the pupil from six directions. In this case, when attention is paid to a diffracted light from one direction, the diffracted light passes through the pupil with a tilt. FIG. 5D shows the relationship between the distribution of a diffracted light which obliquely enters the pupil from one direction, and the pupil filter. In FIG. 5D, a large circle indicates the pupil position, and small circles which fall within the pupil indicate regions with high transmittances in a transmittance distribution formed by the pupil filter. Note that regions to be outside the small circles have zero transmittance.

Because the pupil filter shown in FIG. 5C have high transmittances in six directions, only light beams diffracted in the vicinities of the six regions with high transmittances in the transmittance distribution is passed through the pupil. In this case, three diffracted lights: one 0th-order diffracted light and two 1st-order diffracted lights pass through the pupil, and form an image by interfering with each other.

Figure 5E:
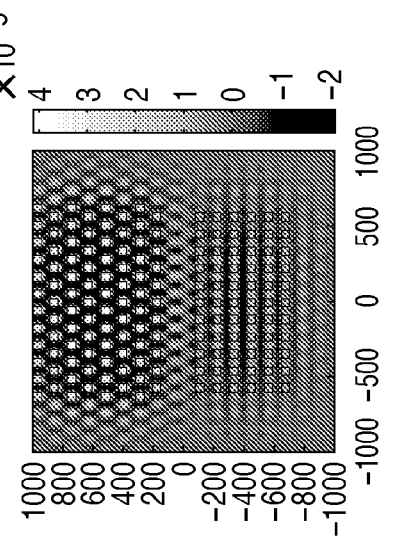

FIG. 5E shows the calculated intensity distribution. As can be seen by referring to FIG. 5E, only the pattern PT1 is imaged, and the pattern PT2 is not imaged.

Figure 5F:
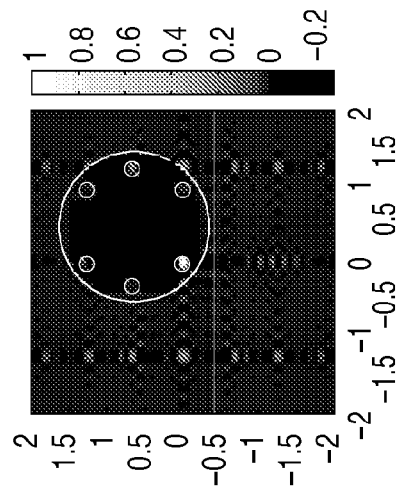

Peak positions where the intensity has peaks in the intensity distribution shown in FIG. 5E are specified. Pattern elements (first pattern elements) which include the specified peak positions are extracted from the plurality of pattern elements when a temporary target pattern corresponding to the target pattern shown in FIG. 2A is projected onto the image plane (see FIG. 5F). In FIG. 5F, circles indicate peak positions and are superposed on the plurality of pattern elements which form the temporary target pattern. Data on a pattern including the thus extracted first pattern elements (that is, a pattern suited to the first effective source: FIG. 5B) is generated as mask data of one of a plurality of masks for use in multiple exposure.

Figure 7A:
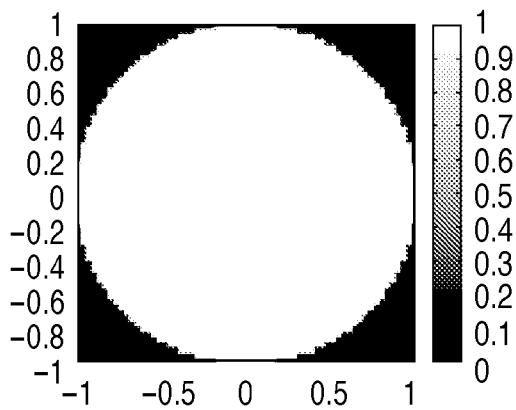
FIGS. 7A to 7C are views for explaining the mask data generation in the first embodiment.
Figure 7B:
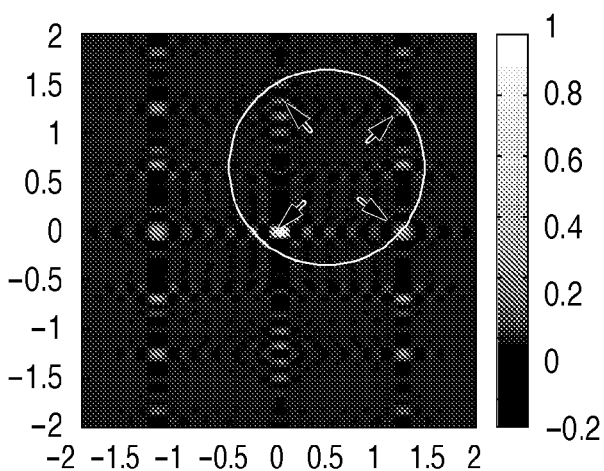
Figure 7C:
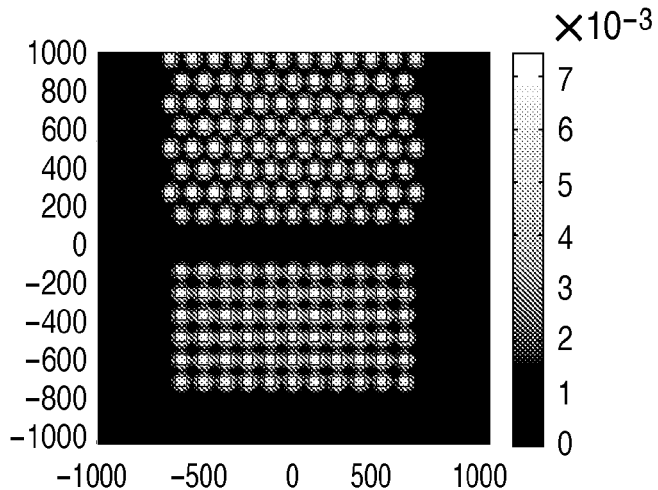

A case in which the above-mentioned process is performed without postulating a pupil filter (that is, by forming a uniform transmittance distribution on the pupil plane) will be explained herein in order to reveal the effect of a pupil filter. As shown in FIG. 7A, a pupil filter which forms a uniform transmittance distribution on the pupil plane is assumed. FIG. 7B shows the relationship between the diffracted light distribution and the pupil filter. FIG. 7C shows an intensity distribution calculated using the target pattern shown in FIG. 2A, the effective source shown in FIG. 5B, and the pupil filter shown in FIG. 7A.

When the pupil filter forms a uniform transmittance distribution on the pupil plane, the diffracted light distribution in the entire region which falls within a circle indicating the pupil position passes through the pupil with a tilt, as shown in FIG. 7B. In this case, three light beams: one 0th-order diffracted light and two 1st-order diffracted lights interfere with each other, and four light beams: one 0th-order diffracted light and three 1st-order diffracted lights interfere with each other (four diffracted lights which interfere with each other are indicated by arrows in FIG. 7B). Thus, as shown in FIG. 7C, the pattern PT2 is also imaged, together with the pattern PT1, although the pattern PT2 has a contrast weaker than the pattern PT1.

In this manner, a pattern other than that suited to an effective source is also imaged when only the effective source is determined, but only a pattern suited to the determined effective source is imaged by postulating a pupil filter.

Figure 8:
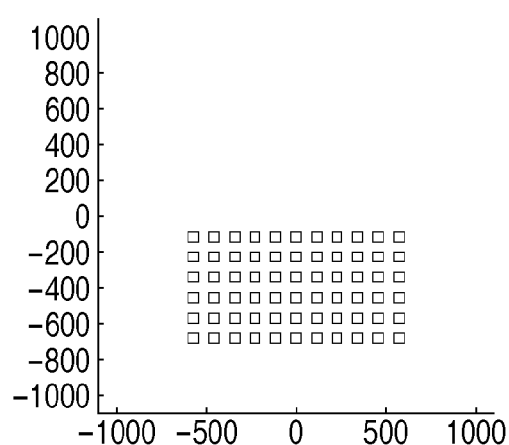
FIG. 8 is a view for explaining the mask data generation in the first embodiment.

After data on a pattern including the first pattern elements is generated as mask data, a pattern including second pattern elements, obtained by excluding the first pattern elements from the target pattern shown in FIG. 2A, is set as a new target pattern (a temporary target pattern corresponding to it), as shown in FIG. 8. The above-mentioned process is then repeated.

Figure 9C:
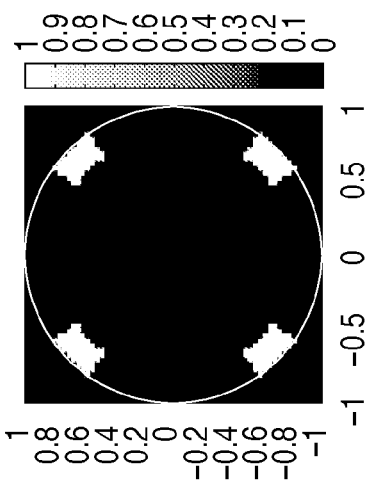
FIGS. 9A to 9F are views for explaining the mask data generation in the first embodiment.
Figure 9B:
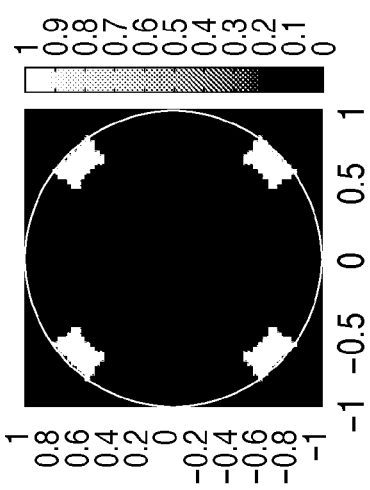
Figure 9A:
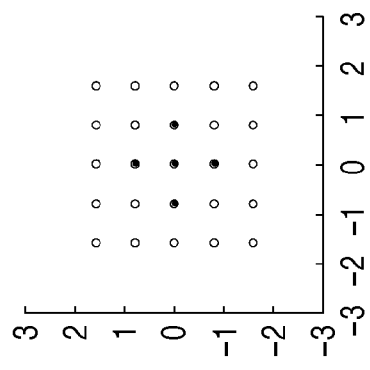

More specifically, as shown in FIG. 9A, a map indicating the relative positional relationship among a plurality of pattern elements which form a temporary target pattern corresponding to the target pattern shown in FIG. 8 is generated. Five pattern elements (indicated by black dots in FIG. 9A) which form an array pattern that causes four light beams diffracted by the pattern elements to interfere with each other are extracted from the map shown in FIG. 9A. Note that the five pattern elements are those positioned at X=0 and have a minimum resolvable pitch in the Y direction, and those positioned at Y=0 and have a minimum resolvable pitch in the X direction.

Next, a second effective source corresponding to the array pattern of the pattern elements (black dots) extracted from the map shown in FIG. 9A is determined, and regions with high intensities are extracted, as shown in FIG. 9B, from the second effective source. FIG. 9B shows regions of high intensities as the effective source on the pupil plane. A pupil filter which forms a transmittance distribution, according to the regions extracted from the second effective source is assumed, as shown in FIG. 9C (that is, a transmittance distribution of pupil filter corresponds to the intensity distribution shown in FIG. 9B).

Figure 9F:
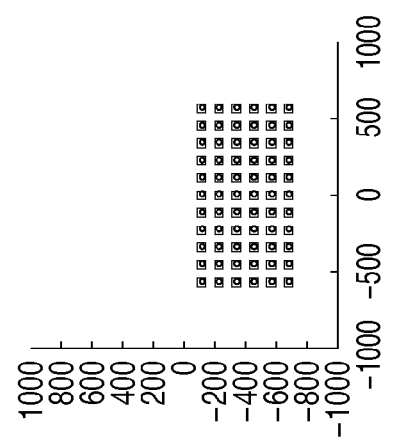
Figure 9E:
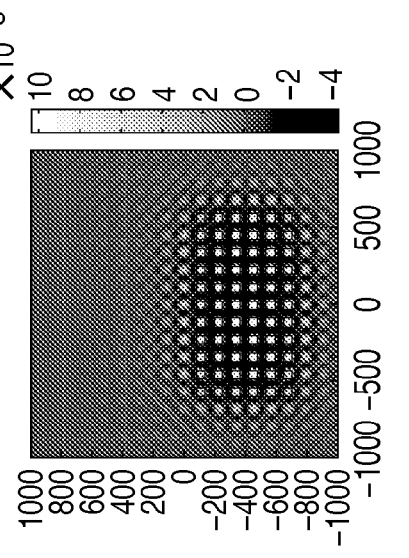
Figure 9D:
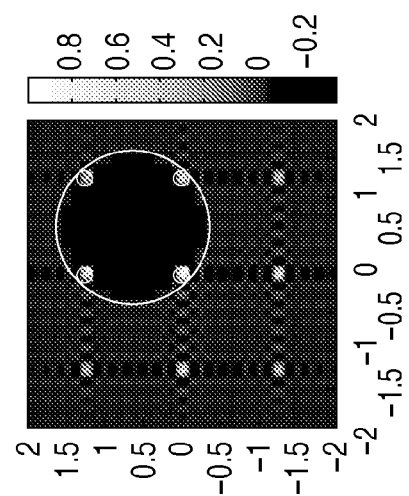

FIG. 9D shows the relationship between the diffracted light distribution and the pupil filter. In FIG. 9D, a large circle indicates the pupil position, and small circles which fall within the pupil indicate regions with high transmittances in a transmittance distribution formed by the pupil filter. Note that regions to be outside the small circles have zero transmittance. Of the diffracted light, only diffracted components to be passed through regions which have high transmittances are formed.

An aerial image formed on the image plane is calculated using the target pattern shown in FIG. 8, the effective source shown in FIG. 9B, and the pupil filter shown in FIG. 9C. FIG. 9E shows the calculated intensity distribution. Four diffracted lights: one 0th-order diffracted light and three 1st-order diffracted lights pass through the pupil via the pupil filter, and form an image by interfering with each other.

Peak positions where the intensity has peaks in the intensity distribution shown in FIG. 9E are specified. Pattern elements (first pattern elements) that include the specified peak positions are extracted from the plurality of pattern elements when a temporary target pattern corresponding to the target pattern shown in FIG. 8 is projected onto the image plane (see FIG. 9F). In FIG. 9F, circles indicate peak positions and are superposed on the plurality of pattern elements which form the temporary target pattern. Data on a pattern including the thus extracted pattern elements (that is, a pattern suited to the effective source) is generated as mask data of one of a plurality of masks for use in multiple exposure.

When the first pattern elements are excluded from the target pattern shown in FIG. 8, the number of remaining pattern elements (that is, second pattern elements) becomes zero, so the process of generating mask data ends.

In this manner, the target pattern shown in FIG. 2A is divided into the first pattern PT1 and the second pattern PT2. The first effective source (FIG. 5B) is suited to the first pattern PT1, whereas the second effective source (FIG. 9B) is suited to the second pattern PT2.

Second Embodiment

Figure 10A:
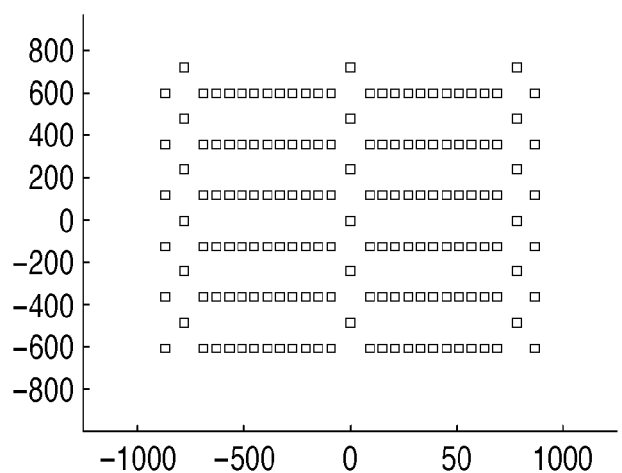
Figure 10A:
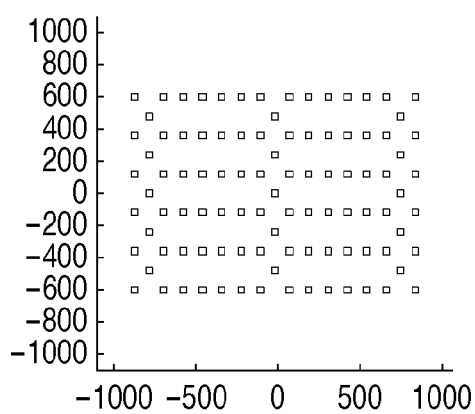
Figure 10A:
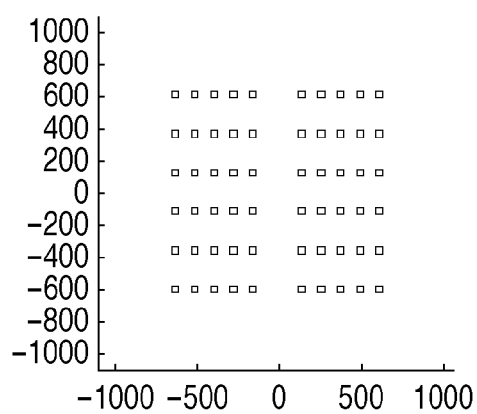
Figure 10A:
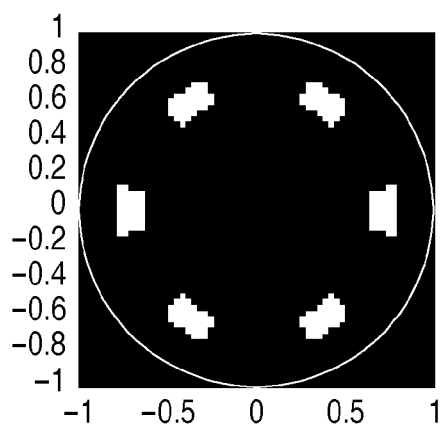
Figure 10A:
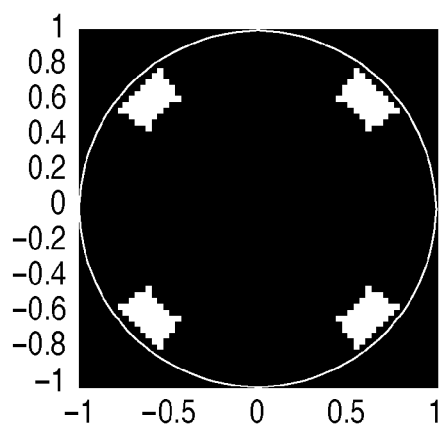

As a target pattern, a pattern is assumed in which pattern elements are two-dimensionally arranged, and the minimum half pitch HP is 30 (nm), as shown in FIG. 10A. In other words, the half pitch of the target pattern is k1=30 (nm)/(193 (nm)/1.35)=0.21. Note that in FIG. 10A, the ordinate and abscissa indicate the dimensions (nm) corresponding to the scale on the image plane of the projection optical system.

FIGS. 10B and 10C show patterns divided by executing a mask data generating program according to this embodiment (that is, the results of dividing the target pattern shown in FIG. 10A). Also, FIGS. 10D and 10E show effective sources suited to the patterns shown in FIGS. 10B and 10C, respectively.

Figure 11A:
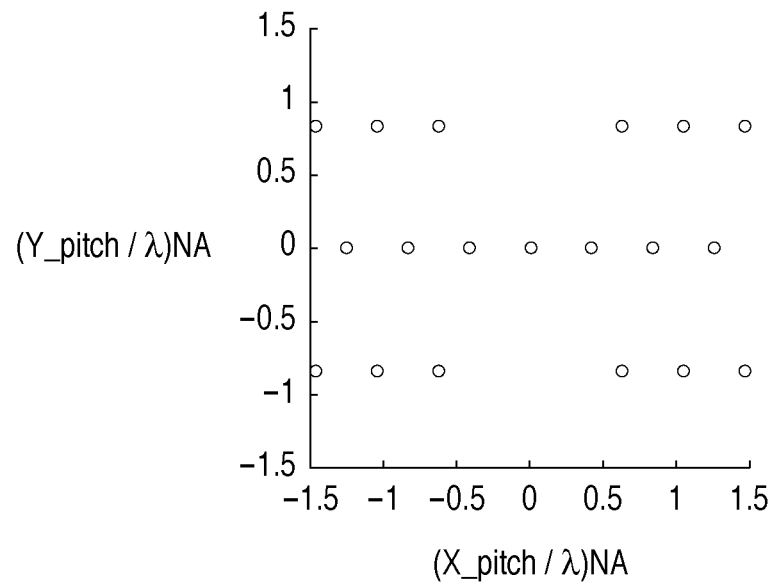
FIGS. 11A and 11B are views for explaining the mask data generation in the second embodiment.

First, a map shown in FIG. 11A is generated as a map indicating the relative positional relationship among a plurality of pattern elements which form a temporary target pattern corresponding to the target pattern shown in FIG. 10A. Pattern elements with a periodicity are extracted from the map shown in FIG. 11A (see FIG. 11B).

Although a general pattern has a mixture of pattern elements with a plurality of pitches, pattern elements with the same pitch are extracted in order to obtain a group including pattern elements, which are easy to resolve. Nevertheless, when different groups are obtained individually for pattern elements with different pitches, this generates a large number of groups. To prevent this, pattern elements with neighboring pitches are desirably classified into the same group.

Pattern elements with pitches different from each other by 1.5 times (that is, pattern elements with forbidden pitches) are hard to image as separate images. Hence, pattern elements with such pitches must not be classified into the same group. Pattern elements with a half pitch equal to or less than a resolution limit (0.25λ/NA) are also hard to image by one exposure. Hence, pattern elements with such a pitch are desirably divided into two groups. To do this, a pitch equal to or less than a resolution limit is substituted by a double pitch. Also, pattern elements with a large pitch is substituted by a ½ (or 1/n) pitch. And, pattern elements are extracted within the range of ±10° with respect to straight lines which connect a certain pattern element to respective pattern elements as that three-beam interference or four-beam interference can be performed. In the diffracted light distribution on the pupil plane, pattern elements each of which allows three or more diffracted lights including one 0th-order diffracted light to enter the pupil, is about 70% (1/1.5) a maximum resolvable diffracted light (high frequency), and falls within the range of ±10° with respect to the pitch direction of a certain pattern are extracted.

Figure 11B:
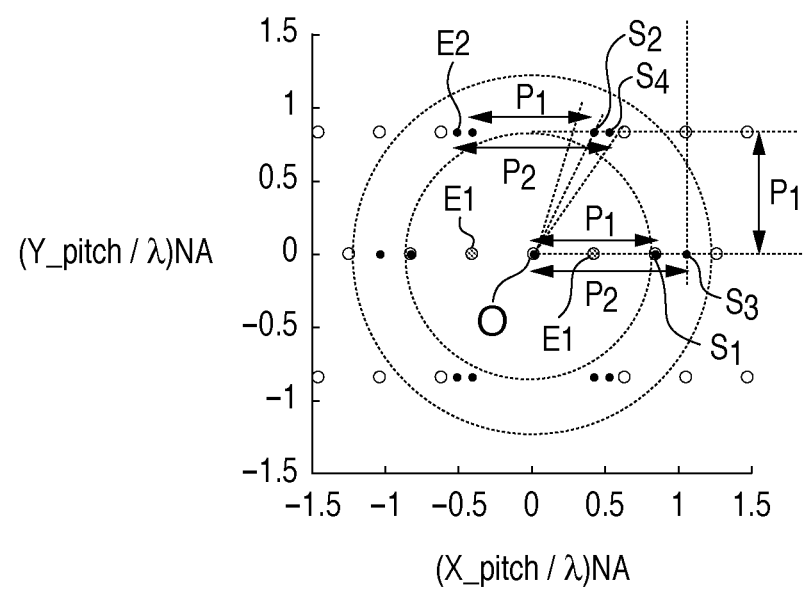

Extraction of pattern elements with a periodicity will be explained with reference to FIG. 11B. First, pattern elements symmetrical about the X- and Y-axes are extracted from only the first quadrant. If pattern elements are present at X=0 and Y≠0, pattern elements which give rise to four-beam interference are extracted. In FIG. 11B, pattern elements are absent at X=0 and Y≠0, so pattern elements which give rise to three-beam interference are extracted.

In FIG. 11B, pattern elements corresponding to k1=0.21 are indicated by E1 (gray dots) as pattern elements with a minimum half pitch. Since the pattern elements E1 cannot resolve, pattern elements E2 (black dots) are extracted. When the minimum resolvable half pitch is substituted by $HP_{1X}$=0.42, a pattern element $S_1$ is obtained. The minimum resolvable half pitch in the Y direction is $HP_{1Y}$=0.42.

The pattern element S1 on the X-axis (Y=0) with a minimum resolvable half pitch is obtained first, to extract pattern elements which cause three-beam interference.

A pattern element $S_2$ is assumed at a position which shifts by the half pitch of the pattern element $S_1$ in the X direction from the pattern element O. However, a pitch on Y=$P_1$ is not taken into consideration in this state. Pattern elements should be extracted, within a circle with a radius which is 1.5 times the minimum half pitch and within the range of ±10° with respect to the pitch direction but no pattern elements fall within this range. Note that the pitch direction means the direction of a straight line which connects the origin O and the pattern element $S_1$ or $S_2$. Hence, when the pitches of pattern elements on Y=$P_1$ are halved, pattern elements $S_3$ and $S_4$ ($HP_{2X}$=0.63 and $HP_{2Y}$=0.42) with a pitch $P_2$ are obtained within the above-mentioned range.

The conditions which let diffraction of light make three-beam interference are the peak positions in the first quadrant of the effective source, (s1, θ1) and (s2, θ2) in the polar coordinates are described as:

(1) When three light beams diffracted by the pattern elements O, $S_1$, and $S_2$ interfere with each other, we have:

$$\theta_1 = 2a\tan(0.5 HP_{1X}/HP_{1Y})$$

$$s_1 = 1/(4HP_{1Y})/\sin(\theta_1)$$

from $HP_{1X}$=0.42 and $HP_{1Y}$=0.42

(2) When three light beams diffracted by the pattern elements O, $S_3$, and $S_4$ interfere with each other, we have:

$$\theta_2 = 2a\tan(0.5 HP_{2X}/HP_{2Y})$$

$$s_2 = 1/(4HP_{2Y})/\sin(\theta_2)$$

from $HP_{2X}$=0.63 and $HP_{2Y}$=0.42

A light source which has peaks at the average positions of these pattern elements is determined as an effective source. Also, a light source as shown in FIG. 12 is obtained using a general method, source optimization, from a pattern including these pattern elements. Regions with high intensities may be extracted from the light source shown in FIG. 12, and determined as an effective source.

A case in which an effective source is obtained from a diffracted light distribution will be explained. FIG. 13A shows in-phase peak positions in the target pattern shown in FIG. 10A. Referring to FIG. 13A, only two light beams which are diffracted by the pattern elements O and $S_3$, enter the pupil even if it tilt. This is because the pitch in the X direction is too small to resolve, and therefore has too high a frequency to pass through the pupil. Peak positions as shown in FIG. 13B are obtained by halving the pitches of pattern elements in the X direction in a frequency so as to substitute a pitch equal to or less than a resolution limit by a pitch double this pitch to substitute the peak positions of the diffracted lights. In FIG. 13B, three light beams which are diffracted by the pattern elements O, $S_1$, and $S_2$, enter the pupil if it tilt. A hexapole illumination is obtained from the position of the 0th-order diffracted light within the pupil.

A pupil filter which forms a transmittance distribution, according to which it transmits light beams from regions which have high intensities and are extracted from the first effective source, on the pupil plane is assumed, and an intensity distribution (aerial image) formed on the image plane is calculated using the target pattern shown in FIG. 10A (or its some elements), the first effective source, and the pupil filter.

The first effective source is suited to the average pitch of pattern elements which have the pitches $HP_1$ and $HP_2$ and are included in the target pattern shown in FIG. 10A. In other words, the first effective source is not optimum for individual pattern elements with the pitches $HP_1$ and $HP_2$, but realizes an average imaging performance for these two pitches. Hence, pattern elements with these two pitches can be selected as a single group.

Peak positions where the intensity has peaks in the calculated intensity distribution are specified. Pattern elements which include the specified peak positions are extracted from the plurality of pattern elements when a temporary target pattern corresponding to the target pattern shown in FIG. 10A is projected onto the image plane. However, in this case, the intensity distribution has so weak a contrast that not all pattern elements can be extracted. To combat this situation, an intensity distribution formed on the image plane is calculated again using a pattern including only the extracted pattern elements as a target pattern. When the number of extracted pattern elements reaches a predetermined number upon repeating this calculation, they are determined as first pattern elements.

Figure 14A:
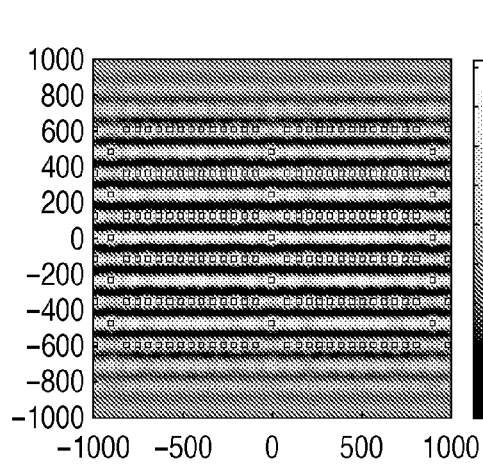
FIGS. 14A to 14D are views for explaining the mask data generation in the second embodiment.
Figure 14B:
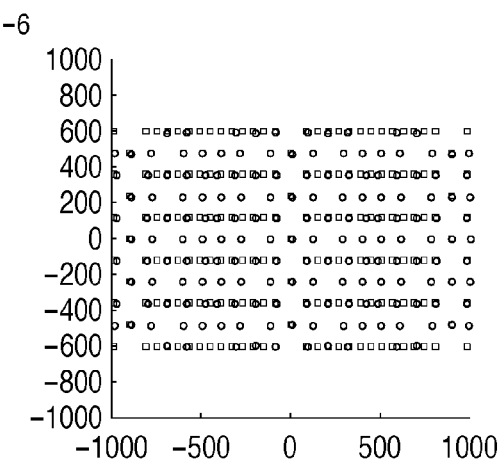
Figure 14C:
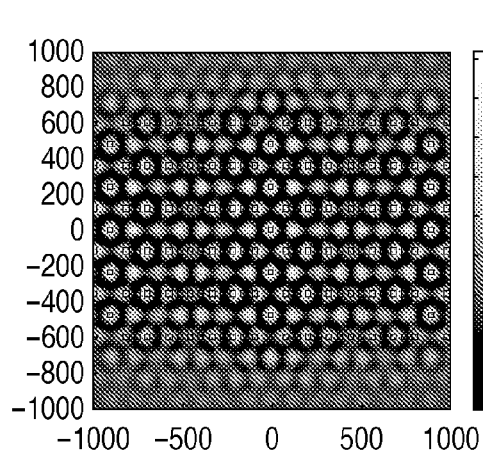
Figure 14D:
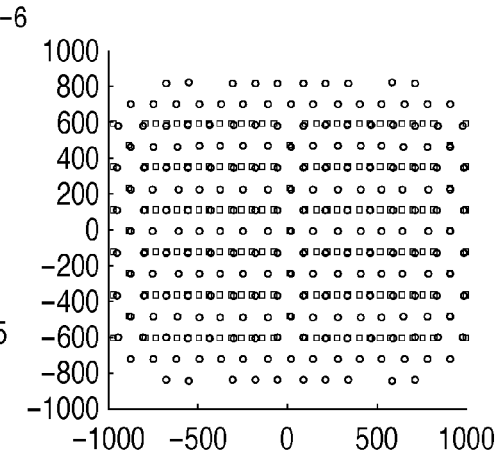

FIG. 14A shows an intensity distribution (first time) formed on the image plane by light diffracted by a temporary target pattern corresponding to the target pattern shown in FIG. 10A. In FIG. 14B, circles indicate peak positions with intensities equal to or higher than a predetermined value in the intensity distribution shown in FIG. 14A, and are superposed on the plurality of pattern elements which form the temporary target pattern projected onto the image plane. Also, FIG. 14C shows an intensity distribution (second time) formed on the image plane by light diffracted by the pattern elements extracted based on the peak positions shown in FIG. 14B. In FIG. 14D, circles indicate peak positions with intensities equal to or higher than a predetermined value in the intensity distribution shown in FIG. 14C, and are superposed on the plurality of pattern elements which form the temporary target pattern projected onto the image plane. Note that the number of pattern elements extracted by calculating an intensity distribution (third time) formed on the image plane by light diffracted by the pattern elements extracted based on the intensity distribution shown in FIG. 14C is the same as the previous time, so the extraction of pattern elements ends after an intensity distribution is obtained the second time. In this way, the pattern elements shown in FIG. 10B are extracted as first pattern elements.

After data on a pattern including the first pattern elements is generated as mask data, a pattern including second pattern elements, obtained by excluding the first pattern elements from the target pattern shown in FIG. 10A, is set as a new target pattern (a temporary target pattern corresponding to it), as shown in FIG. 15. The above-mentioned process is then repeated.

Maps shown in FIGS. 16A and 16B are generated as maps indicating the relative positional relationships among a plurality of pattern elements which form a temporary target pattern corresponding to the target pattern shown in FIG. 15. In FIGS. 16A and 16B, open circles indicate mapped pattern elements, and filled circles indicate pattern elements to be extracted (that is, with a periodicity).

Since pattern elements are present at X=0 and Y≠0 and align themselves in the Y direction, pattern elements which give rise to four-beam interference are extracted. More specifically, a pattern element $S_1$ on the X-axis (Y=0) with a minimum half pitch is obtained first. A pattern element $S_2$ on the Y-axis (X=0) with a minimum half pitch is obtained next. The periodic direction is that of a straight line which connects the origin O and the pattern element $S_1$, or that of a straight line which connects the origin O and the pattern element $S_2$. Pattern elements which fall within a circle with a radius (length) 1.5 times the minimum half pitch and within the range of ±10° with respect to the periodic direction are extracted.

Referring to FIG. 16A, the half pitch of the pattern element $S_1$ on the X-axis (Y=0) is $HP_{1X}$=0.42 (the pitch is $P_X$=0.84). The half pitch of the pattern element $S_2$ on the Y-axis (X=0) is $HP_{1Y}$=0.84 (the pitch is $P_Y$=1.68). No pattern elements fall within a circle with a radius 1.5 times the minimum pitch and within the range of ±10° with respect to the periodic direction.

Referring to FIG. 16B as well, the half pitch of the pattern element $S_1$ is $HP_{1X}$=0.42, and the minimum half pitch in the Y direction can resolve even when it is halved, so $HP_{1Y}$=0.42 may be set (the pitch is $P_Y$=0.84).

In this manner, the target pattern can be divided by extracting pattern elements using either method as shown in FIG. 16A or 16B. For example, pattern elements are extracted, as shown in FIG. 16B, to set an effective source (second effective source) which gives rise to four-beam interference.

Letting $(s_1, \theta_1)$ be the polar coordinates of four peak positions in the effective source, the conditions of four-beam interference are described as:

$$\theta_1 = a\tan(HP_{1X}/HP_{1Y})$$

$$s_1 = 1/(4HP_{1Y})/\sin(\theta_1)$$

from $HP_{1X}$=0.42 and $HP_{1Y}$=0.42

Figure 17:
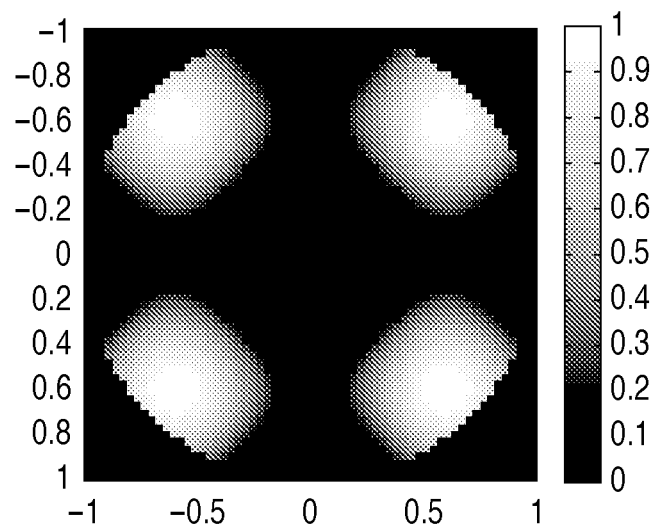
FIG. 17 is a view for explaining the mask data generation in the second embodiment.

A light source as shown in FIG. 17 is obtained using a general method from a pattern including these pattern elements. Regions with high intensities may be extracted from the light source shown in FIG. 17, and determined as a second effective source.

Figure 18:
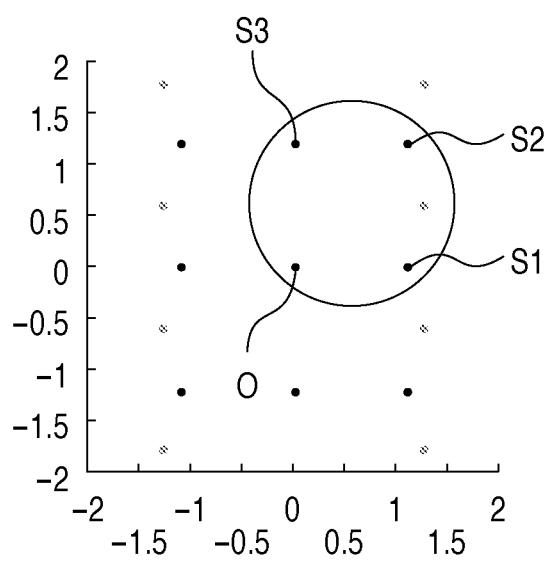
FIG. 18 is a view for explaining the mask data generation in the second embodiment.

A case in which an effective source is obtained from a diffracted light distribution will be explained. FIG. 18 shows in-phase peak positions in the target pattern shown in FIG. 15. Referring to FIG. 18, four light beams (light beams diffracted by the pattern elements O, $S_1$, $S_2$, and $S_3$) enter the pupil upon a shift in pupil position. A quadrupole effective source (quadrupole illumination) is obtained from the position of the 0th-order diffracted light within the pupil.

A pupil filter which forms a transmittance distribution, according to the regions extracted from the second effective source, and the pupil filter is assumed. Peak positions where the intensity has peaks in the calculated intensity distribution are specified. Pattern elements which include the specified peak positions are extracted from the plurality of pattern elements when a temporary target pattern corresponding to the target pattern as shown in FIG. 10A is projected onto the image plane. In this way, the target pattern shown in FIG. 10A is divided into the patterns shown in FIGS. 10B and 10C, respectively. Although the effective sources shown in FIGS. 10D and 10E, respectively, are used to divide the target pattern in that case, uniform images are obtained using the effective sources shown in FIGS. 12 and 17, respectively, in actual exposure.

In this manner, the target pattern shown in FIG. 10A is divided into two patterns: the pattern shown in FIG. 10B suited to the first effective source (FIG. 10D), and that shown in FIG. 10C suited to the second effective source (FIG. 10E).

Figure 19A:
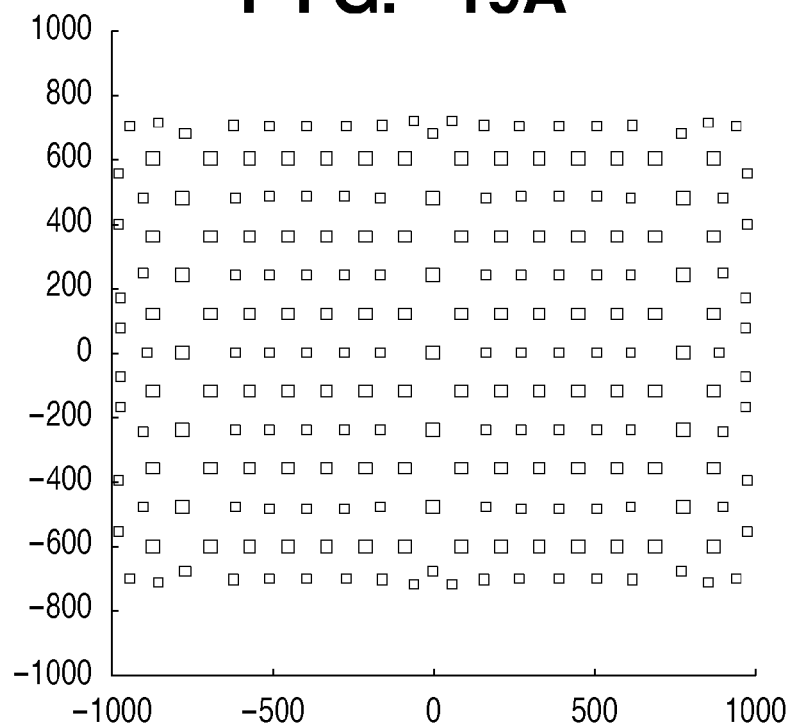
FIGS. 19A and 19B are views for explaining the mask data generation in the second embodiment.

Assuming the patterns shown in FIGS. 10B and 10C, respectively, as target patterns, the patterns of masks (mask patterns) for resolving these target patterns will be explained herein. When an approximate aerial image is calculated based on, for example, 2D-TCC using the pattern shown in FIG. 10B and the first effective source, a main pattern is deformed based on the approximate aerial image, and auxiliary patterns are inserted into the main pattern, a mask pattern shown in FIG. 19A is obtained. In contrast, when the pattern shown in FIG. 10C and the second effective source are used, a mask pattern shown in FIG. 19B is obtained.

Figure 19B:
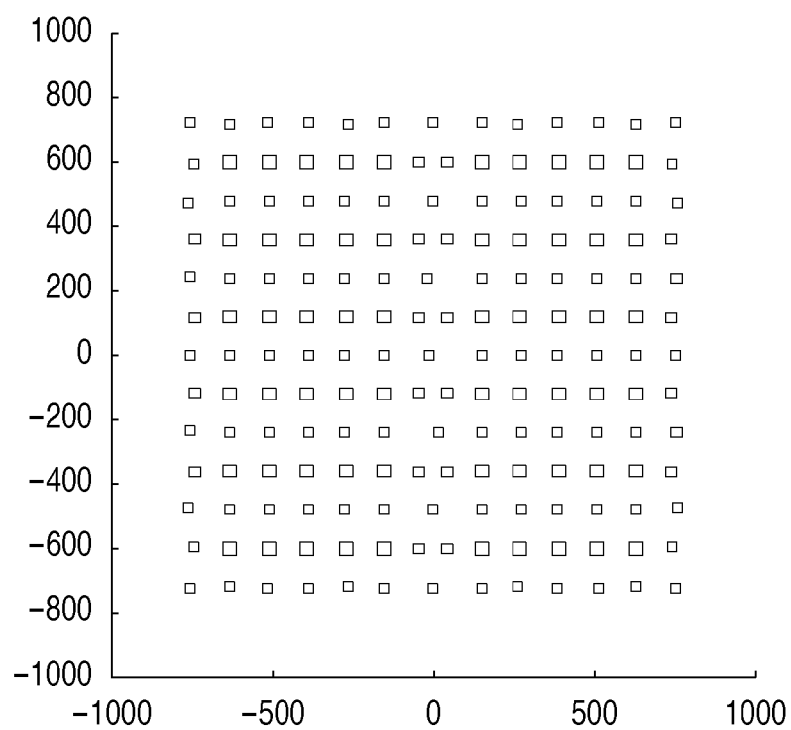

A diffracted light distribution generated by a mask pattern (that is, a pattern to be divided) obtained from the target pattern shown in FIG. 10A, and those generated by the mask patterns (that is, divided patterns) shown in FIGS. 19A and 19B are compared with each other. FIG. 20A shows a diffracted light distribution generated by a mask pattern obtained from the target pattern shown in FIG. 10A. FIG. 20B shows a diffracted light distribution generated by the mask pattern shown in FIG. 19A. FIG. 20C shows a diffracted light distribution generated by the mask pattern shown in FIG. 19B. The diffracted light distribution shown in FIG. 20A has in-phase peak positions as shown in FIG. 13A. The diffracted light distribution shown in FIG. 20B has in-phase peak positions corresponding to FIG. 13B. The diffracted light distribution shown in FIG. 20C has in-phase peak positions corresponding to FIG. 18.

In FIG. 13A, the diffracted light on the abscissa (X direction) has so small a pitch that a 0th-order diffracted light and 1st-order diffracted lights cannot simultaneously pass through the pupil even upon a shift in pupil position, and this pitch does not resolve. Dividing the pattern at a pitch double the current pitch generates new diffracted light at a pitch half the current pitch, as described above. However, when the mask patterns shown in FIGS. 19A and 19B, respectively, are superposed on each other (synthesized), they have opposite phases and therefore are cancelled. In FIGS. 13B and 18, gray dots indicate diffracted lights excluded by taking account of the effective source (illumination condition).

Third Embodiment

Figure 21A:
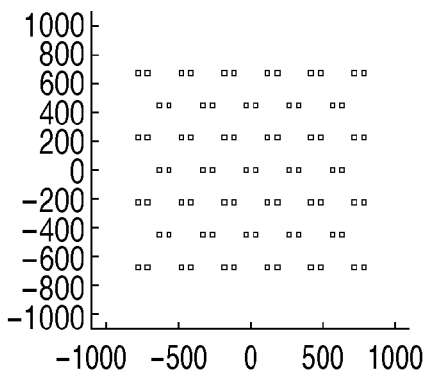
FIGS. 21A to 21I are views for explaining mask data generation in the third embodiment.

A target pattern is assumed that pattern elements are two-dimensionally arranged, and the minimum half pitch HP is 34 (nm), as shown in FIG. 21A. In other words, the half pitch of the target pattern is k1=34 (nm)/(193 (nm)/1.35)=0.24. Also, the pattern elements are assumed to have a half pitch of 150 (nm) in the horizontal direction, and a half pitch of 112 (nm) in the vertical direction. Pattern elements in one row are assumed to shift from those in an adjacent row by a half pitch.

Figure 21B:
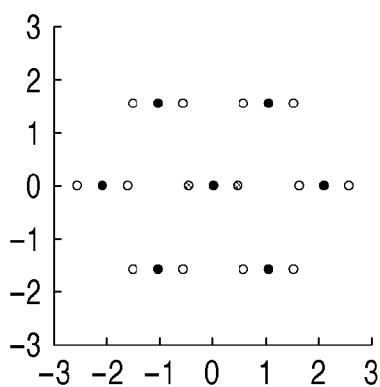

First, a map shown in FIG. 21B is generated as a map indicating the relative positional relationship among a plurality of pattern elements which form a temporary target pattern corresponding to the target pattern shown in FIG. 21A. Note that in FIG. 21B, gray dots indicate pattern elements corresponding to a minimum half pitch k1=0.24. Since these pattern elements cannot resolve, pattern elements indicated by black dots are extracted.

Figure 21C:
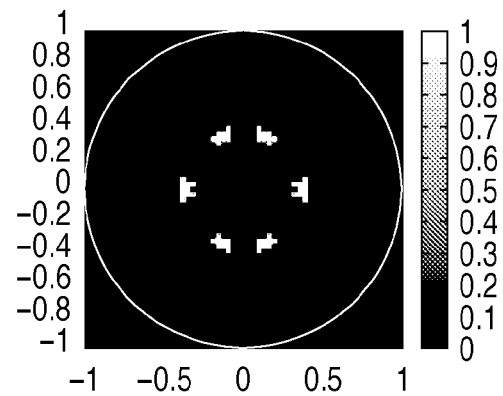

An effective source corresponding to pattern elements indicated by black dots is determined, and a pupil filter which forms a transmittance distribution, according to the regions with high intensities in the effective source, on the pupil plane is assumed (see FIG. 21C).

Figure 21D:
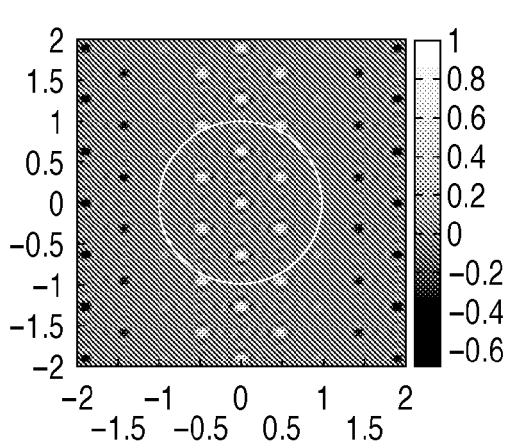

A diffracted light distribution as shown in FIG. 21A is obtained (see FIG. 21D). Also, an aerial image formed on the image plane is calculated using the target pattern shown in FIG. 21A, the effective source shown in FIG. 21C, and the pupil filter (see FIG. 21E).

Figure 21E:
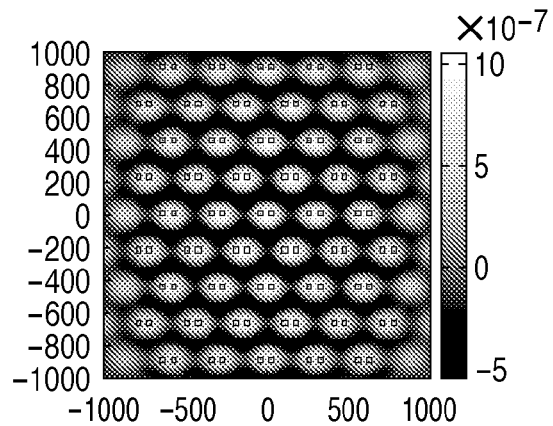
Figure 21F:
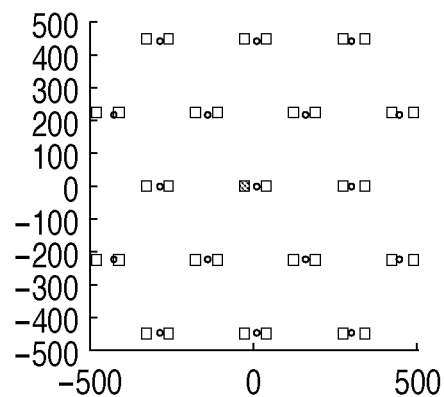
Figure 21G:
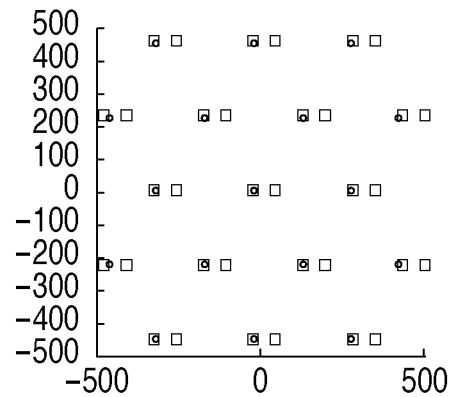

Peak positions in the intensity distribution shown in FIG. 21E are specified (see FIG. 21F). However, as shown in FIG. 21F, pattern elements which include the specified peak positions when a temporary target pattern corresponding to the target pattern shown in FIG. 21A is projected onto the image plane are absent. Hence, as shown in FIG. 21G, attention is paid to pattern elements indicated by gray dots in FIG. 21F, and the pattern elements are shifted so as to be superposed on the peak positions (that is, so as to include the peak positions). After that, as shown in FIG. 21H, pattern elements which include the peak positions are extracted as first pattern elements, and data on a pattern including the first pattern elements is generated as mask data.

Figure 21H:
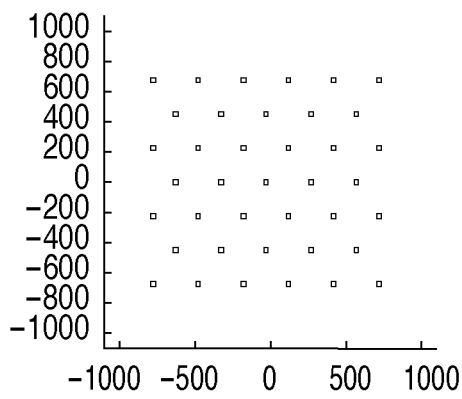
Figure 21I:
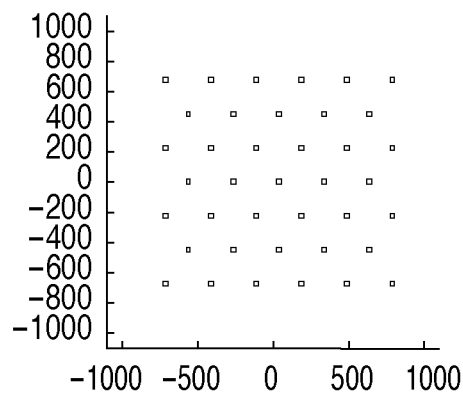

When the first pattern elements shown in FIG. 21H are excluded from the target pattern shown in FIG. 21A, pattern elements which are arrayed in the same pattern as the pattern elements shown in FIG. 21H, but shift by a minimum half pitch remain, as shown in FIG. 21I. Thus, an effective source corresponding to the pattern elements shown in FIG. 21I is the same as that for the pattern elements shown in FIG. 21H. Also, data on a pattern including the pattern elements shown in FIG. 21I is generated as mask data. In this way, the target pattern shown in FIG. 21A is divided into two patterns: the patterns shown in FIGS. 21H and 21I, respectively.

Fourth Embodiment

Consider the relationship between the periodicity of a mask pattern and pattern resolution on the image plane of the projection optical system. A parallel beam that has illuminated a mask pattern is diffracted at some angle by the periodical structure of the mask pattern. A 0th-order diffracted light (light that directly passes through the pattern) and a 1st-order diffracted light interfere via the projection optical system so as to form a sine wave on the image plane. At this time, the period of the sine wave is determined in accordance with the angle made by the 0th- and 1st-order diffracted lights. As the sine wave has a shorter period and higher frequency, the angle of the 1st-order diffracted light becomes so large that the light cannot pass through the projection optical system, and no image is formed on the image plane. The 1st-order diffracted light cannot form an image unless it enters inside a circle whose radius is twice as large as the pupil radius of the projection optical system ((2×NA)/λ (NA: numerical aperture of projection optical system, λ: wavelength of exposure light)) on the pupil plane of the projection optical system. That is, the angle of the 1st-order diffracted light corresponds to the spatial frequency of the sine wave. Whether a mask pattern is resolvable is determined by the relationship between the angle of the 1st-order diffracted light and the size of the pupil of the projection optical system. In other words, it is necessary to examine whether a pattern is resolvable in the frequency space on the pupil plane of the projection optical system.

Since pattern elements are arranged densely (in close vicinity), the angle of the 1st-order diffracted light is so large that it cannot pass through the pupil of the projection optical system, and it cannot resolve. In this case, when the pattern elements are thinned out to increase the period, the 1st-order diffracted light can pass through the pupil of the projection optical system to resolve the pattern. In other words, thinning out the pattern elements so as to obtain a frequency pattern capable of passing the 1st-order diffracted light through the pupil of the projection optical system makes the pattern resolvable.

In the fourth embodiment, a mask pattern is converted into a diffracted light distribution to generate a map represented by a spatial frequency (to be referred to as a "frequency map" hereinafter), and the frequency map is divided. The divided frequency maps are converted and returned to the mask pattern, thereby generating mask data.

In the first to third embodiments, the positions of pattern elements relative to some pattern element are mapped using the position of the pattern element as an origin, thereby generating a map. Then, pattern elements with a periodicity are selected from the map, thereby dividing pattern elements with different periodicities. In the fourth embodiment, however, a frequency space is divided using a frequency map, thereby dividing pattern elements with different periodicities.

Figure 24:
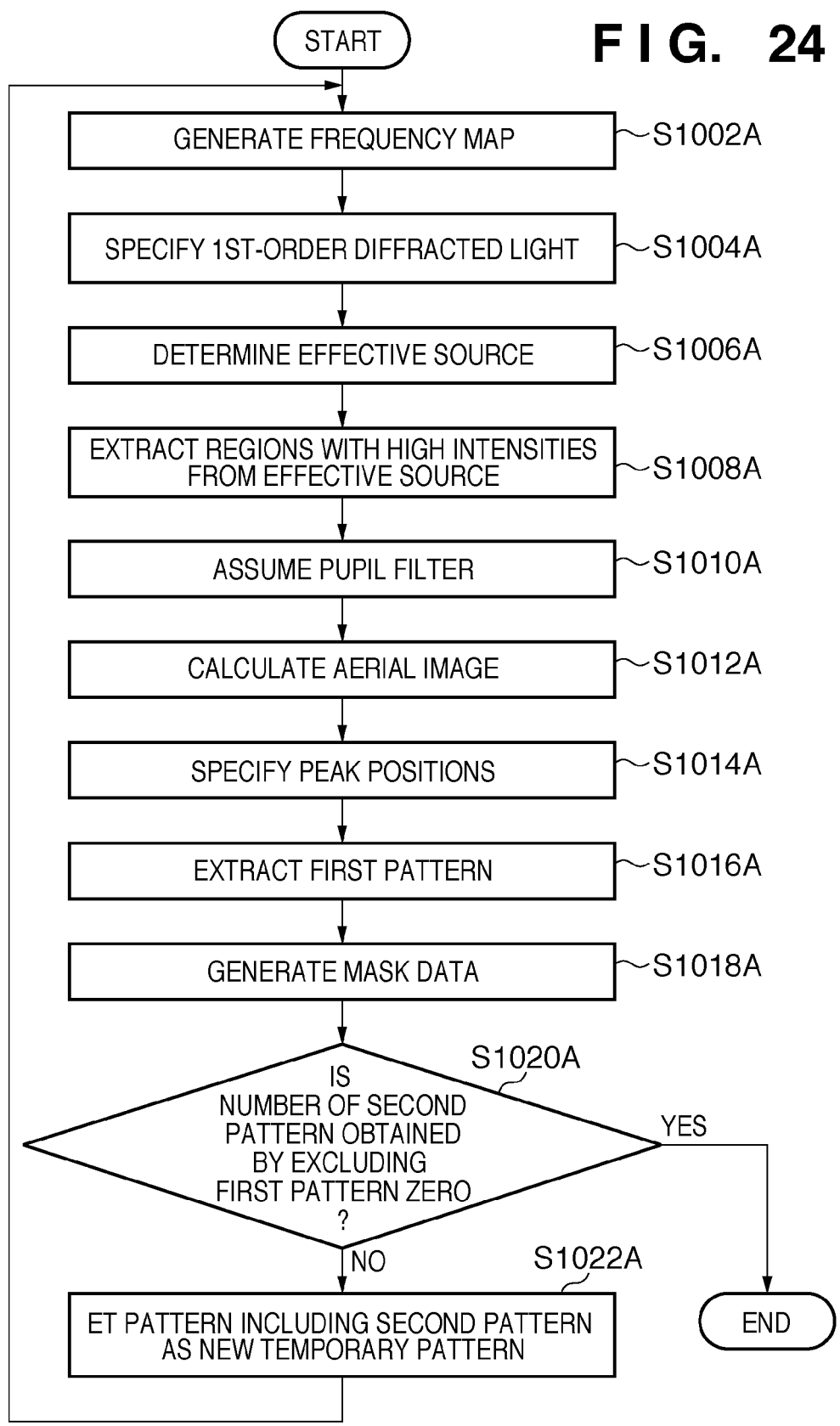
FIG. 24 is a flowchart for explaining a mask data generation in the fourth embodiment.

A process of generating mask data 406 by executing a mask data generating program 401 by a control unit 20 according to the fourth embodiment will be explained with reference to FIG. 24. As described above, pieces of input information such as target pattern data 402 and exposure apparatus information 403 are determined in advance by the user.

In step S1002A (first step), a frequency map is generated based on a temporary target pattern corresponding to a pattern to be formed on a substrate (target pattern). More specifically, a temporary target pattern is Fourier-transformed so as to generate a frequency map on a rectangular coordinate system which represents a distribution of diffracted lights from a plurality of pattern elements of the temporary target pattern by a spatial frequency in a plane perpendicular to the optical axis of the projection optical system. At this time, the frequency map is preferably generated for a spatial frequency up to four times the pupil radius of the projection optical system.

In step S1004A (second step), a 1st-order diffracted light is specified on the frequency map generated in step S1002A, which is located in the first direction of the rectangular coordinate system outside a circle that is centered around the origin of the rectangular coordinate system and is twice as large as the pupil radius of the projection optical system.

In step S1006A (third step), a virtual map is generated by inserting a virtual diffracted light into the frequency map generated in step S1002A, and an effective source corresponding to the virtual map is determined. The virtual diffracted light is inserted at a position defined by shifting the 1st-order diffracted light specified in step S1004A in a direction opposite to the first direction by ½ the frequency of the 1st-order diffracted light and in the second direction perpendicular to the first direction by ±½ the pitch of the 1st-order diffracted light in the second direction. The amplitude of the virtual diffracted light is obtained by multiplying the amplitude of the 1st-order diffracted light specified in step S1004A by a constant. Note that the effective source is determined by, for example, convoluting the shape of the pupil of the projection optical system to diffracted lights having frequency components with the same sign on the virtual map.

In step S1008A, regions with high intensities are extracted from the effective source determined in step S1006A. More specifically, regions with intensity values larger than a predetermined value are extracted from the effective source determined in step S1006A.

In step S1010A (fourth step), a pupil filter which forms a transmittance distribution, according to the regions (regions with intensity values larger than a predetermined value) extracted in step S1008A, on the pupil plane of the projection optical system is assumed. Although a transmittance distribution formed by a pupil filter need not be exactly equal to the distribution of regions with high intensities in an effective source distribution, the process can be simplified by equalizing them.

In step S1012A (fifth step), an aerial image formed on the image plane of the projection optical system is calculated. More specifically, an intensity distribution formed on the image plane of the projection optical system, out of the diffracted lights included in the virtual map generated in step S1006A, the light having passed through the pupil filter assumed in step S1010A is calculated.

Steps S1014A (sixth step), S1016A (seventh step), S1018A (eighth step), S1020A, and S1022A are the same as steps S1014 to S1022 described above, and a detailed description thereof will be omitted here.

The process of generating mask data according to the fourth embodiment will be conceptually explained herein with reference to FIG. 25A to FIG. 25F. As a target pattern which is a dense pattern including a pitch that cannot be resolved by one exposure, as shown in FIG. 25A. More specifically, the pattern elements are arrayed at an non-resolvable pitch in the X direction but at a resolvable pitch in the Y direction.

When the pattern shown in FIG. 25A is Fourier-transformed, a frequency map as shown in FIG. 25B is generated. FIG. 25B shows the peak positions of major diffracted lights (diffracted lights with intensity values larger than a threshold) out of diffracted lights from the pattern elements of the pattern shown in FIG. 25A. Note that the spatial frequency of the frequency map shown in FIG. 25B ranges up to four times the pupil radius of the projection optical system. FIG. 25B shows a circle that is centered around the origin of the rectangular coordinate system and is twice as large as the pupil radius of the projection optical system. The inside of the circle corresponds to the resolvable frequency region. If the light source is assumed to have a distribution up to the pupil radius ($\sigma \leq 1$), 1st-order diffracted light located inside the circle twice as large as the pupil radius can form an image by interfering with 0th-order diffracted light located at the end of the circle by oblique incidence illumination. In FIG. 25A, black dots indicate the peak positions of 0th-order diffracted light and 1st- and higher-order diffracted lights.

Referring to FIG. 25B, concerning the X direction, no 1st- and higher-order diffracted lights are located inside the circle twice as large as the pupil radius. For this reason, the pattern elements arrayed in the X direction are not resolved even using oblique incidence illumination. On the other hand, concerning the Y direction, 1st- and higher-order diffracted lights are located inside the circle twice as large as the pupil radius. Hence, the pattern elements arrayed in the Y direction are resolved. A 1st-order diffracted light (frequency $vx_1$) located in the X direction outside the circle twice as large as the pupil radius is specified on the frequency map shown in FIG. 25B.

Next, virtual diffracted lights are inserted in the circle twice as large as the pupil radius so as to generate a virtual map as shown in FIG. 25D and FIG. 25F. In FIG. 25D and FIG. 25F, a virtual diffracted light (gray dot) is inserted at a position defined by shifting the specified 1st-order diffracted light in the X direction by a frequency $vx_2$ that is ½ the frequency of the 1st-order diffracted light and in the Y direction by ±½ a pitch $\Delta vy$ of the 1st-order diffracted light in the Y direction. Note that the amplitude of the virtual diffracted light on the virtual map shown in FIG. 25D is obtained by multiplying the amplitude of the 1st-order diffracted light by +α. The amplitude of the virtual diffracted light on the virtual map shown in FIG. 25F is obtained by multiplying the amplitude of the 1st-order diffracted light by −α.

The sum of the spatial frequency of the virtual map shown in FIG. 25D and the spatial frequency of the virtual map shown in FIG. 25F equals the spatial frequency of the frequency map shown in FIG. 25B. That is, the frequency map shown in FIG. 25B is divided into the spatial frequency of the virtual map shown in FIG. 25D and the spatial frequency of the virtual map shown in FIG. 25F. Since the frequency components of the virtual diffracted lights in the virtual map shown in FIG. 25D and the frequency components of the virtual diffracted lights in the virtual map shown in FIG. 25F have opposite signs, the 0th-order diffracted lights and 1st-order diffracted lights have opposite phase.

And, inverse Fourier transform of the virtual map shown in FIG. 25D yields a mask pattern shown in FIG. 25C, and inverse Fourier transform of the virtual map shown in FIG. 25F yields a mask pattern shown in FIG. 25E. Note that the target pattern shown in FIG. 25A is obtained by combining the mask pattern shown in FIG. 25C with that in FIG. 25E. That is, the target pattern is divided into two patterns.

Note that the target pattern shown in FIG. 25A is a simple pattern having only one non-resolvable pitch in the X direction. For a pattern having a non-resolvable pitch in the Y direction, the same process as described above is performed in the Y direction as well. If the pattern includes a plurality of pitches, the same process as described above is performed for each pitch.

Figures 26A, 26B:
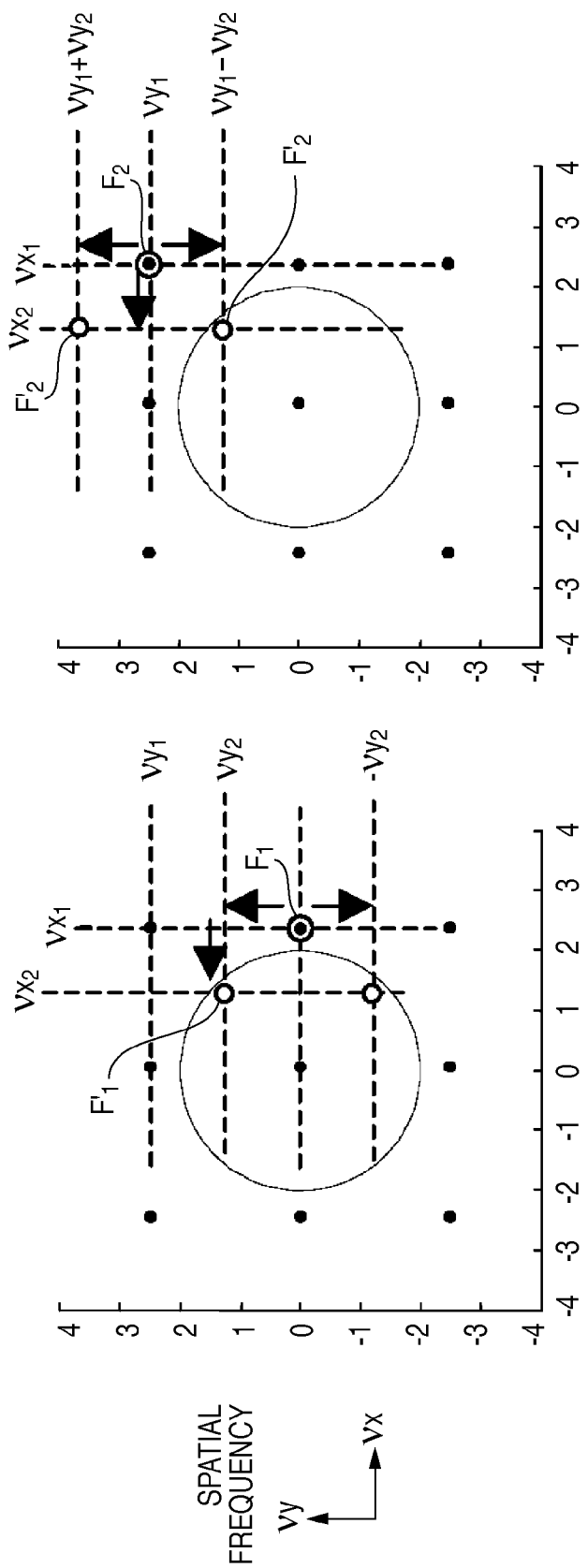
FIGS. 26A and 26B are views for explaining a mask data generation in the fourth embodiment.

Virtual diffracted light insertion in the frequency map will be described in detail with reference to FIG. 26A and FIG. 26B. As shown in FIG. 26A, a focus is placed on a 1st-order diffracted light $F_1$ (frequency $vx_1$) located outside the circle twice as large as the pupil radius concerning the X direction. A virtual diffracted light $F_1'$ whose amplitude is obtained by multiplying the amplitude of the 1st-order diffracted light $F_1$ by $\alpha$, is inserted at a position defined by shifting the position of the 1st-order diffracted light $F_1$ in the X direction by $vx_2=vx_1/2$ and in the Y direction by $\pm vy_2=\pm vy_1/2$.

In addition, a focus is placed on a 1st- or higher-order diffracted light $F_2$ (frequency $vx_1$) located outside the circle twice as large as the pupil radius concerning a direction (Y direction) perpendicular to a line that connects the 1st-order diffracted light $F_1$ and the 0th-order diffracted light. A virtual diffracted light $F_2'$ whose amplitude is obtained by multiplying the amplitude of the diffracted light $F_2$ by $\alpha$, is inserted at a position defined by shifting the position of the diffracted light $F_2$ in the X direction by $vx_2=vx_1/2$ and in the Y direction by $\pm vy_2=\pm vy_1/2$.

The same process is repeated for the two directions, i.e., X- and Y directions to insert virtual diffracted lights in the frequency map, thereby generating a virtual map. Note that a frequency in the frequency space means the angle of a 1st-order diffracted light.

Figure 27A:
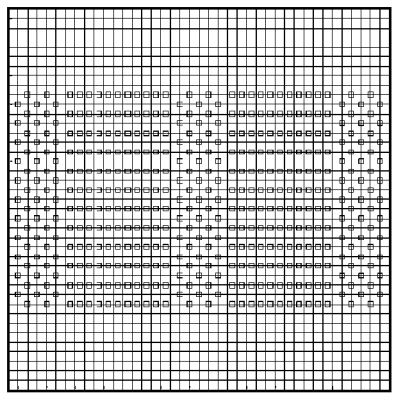
FIGS. 27A to 27F are views for explaining a mask data generation in the fourth embodiment.
Figure 27B:
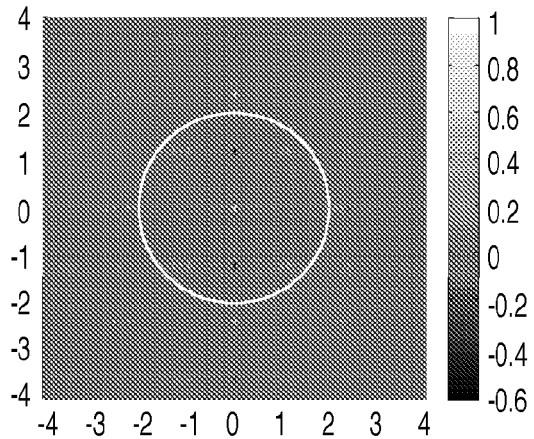

A process of generating mask data for a complicated target pattern will be described below. Elements of a target pattern are two-dimensionally arranged, and includes half pitches of, for example, 30, 60, and 75 nm, as shown in FIG. 27A. The target pattern shown in FIG. 27A is Fourier-transformed so as to generate a frequency map as shown in FIG. 27B. In FIG. 27B, the pupil radius is normalized to 1. FIG. 27B shows a circle that is centered around the origin of the rectangular coordinate system and is twice as large as the pupil radius of the projection optical system.

Referring to FIG. 27B, concerning the Y direction, all 1st-order diffracted lights are located inside the circle twice as large as the pupil radius of the projection optical system. Concerning the X direction, 1st-order diffracted lights corresponding to the half pitch of 75 nm are located inside the circle twice as large as the pupil radius of the projection optical system. However, 1st-order diffracted lights corresponding to the half pitch of 30 nm are not located inside the circle twice as large as the pupil radius of the projection optical system.

Figure 27C:
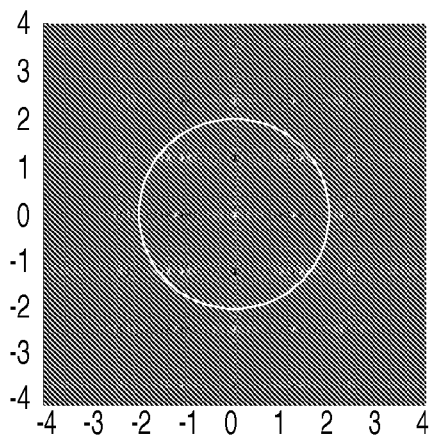
Figure 27D:
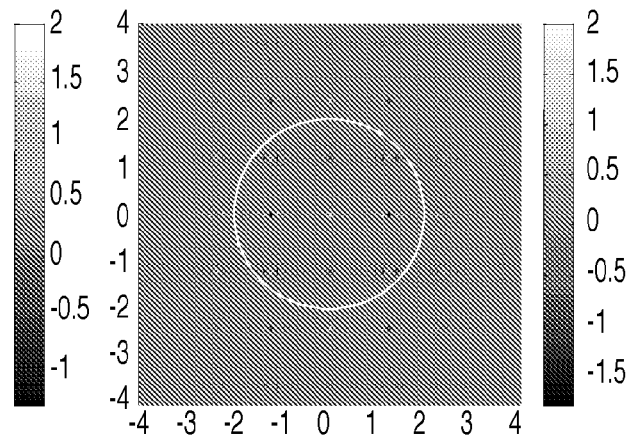

When virtual diffracted lights are inserted in the frequency map shown in FIG. 27B, a virtual map as shown in FIG. 27C or FIG. 27D is generated. Note that the amplitude of the virtual diffracted light in the virtual map shown in FIG. 27C is obtained by multiplying the amplitude of the 1st-order diffracted light by $+\alpha$. The amplitude of the virtual diffracted light in the virtual map shown in FIG. 27D is obtained by multiplying the amplitude of the 1st-order diffracted light by $-\alpha$.

As described above, inverse Fourier transform of the virtual maps shown in c and FIG. 27D yields mask patterns (mask data). However, if the target pattern is complicated, as shown in FIG. 27A, a pattern element may be extracted overlap or may not be extracted in neither map. Hence, the target pattern is not necessarily divided into two patterns. In this case, after an effective source suited to the virtual map shown in FIG. 27C or that shown in FIG. 27D is obtained, pattern elements resolvable by the effective source are extracted.

The effective source is obtained by convoluting the shape of the pupil of the projection optical system to diffracted lights having frequency components with the same sign on the virtual map shown in FIG. 27C or that in FIG. 27D. For example, the diffracted light distribution is defined as a(f,g). Here the coordinates on the pupil plane of the projection optical system is defined as (f,g), and on the pupil plane of the projection optical system the pupil size is normalized as 1. The pupil of the projection optical system is assumed to have a circular shape represented by a circ function. Centered around coordinates (f',g'), circ(f−f',g−g') is 1 within the radius of 1, or 0 otherwise. The weight function of a diffracted light is represented by w(f,g). A diffracted light obtained by extracting a frequency component with the same sign (phase) from the diffracted light distribution a(f,g) is represented by $a_p(f,g)$.

A multiple integral given by $$S_{raw}(f,g)=\iint w(f,g)a_p(f,g)\text{circ}(f-f',g-g')df'dg' \quad (1)$$

is obtained within the ranges of $|f'|\leq 2$ and $|g'|\leq 2$.
Then, $$S(f,g)=S_{raw}(f,g)\text{circ}(f,g) \quad (2)$$

is calculated.

S(f,g) calculated from equation (2) is defined as the intensity distribution of an effective source. In equation (2), the circ function may be 1 when the radius is equal to or smaller than the maximum σ of the optical system, or 0 otherwise.

To attain stronger interference of the diffracted light distribution, the shape of the pupil of the projection optical system is convoluted to diffracted lights having frequency components with the same sign. This is because interference between the diffracted lights having frequency components with the same sign is involved in imaging. For example, if the total amount of diffracted lights having positive frequency components is large on the virtual map, the shape of the pupil of the projection optical system is convoluted to diffracted lights having positive frequency components. On the other hand, if the total amount of diffracted lights having negative frequency components is large on the virtual map, the shape of the pupil of the projection optical system is convoluted to diffracted lights having negative frequency components.

Figure 27E:
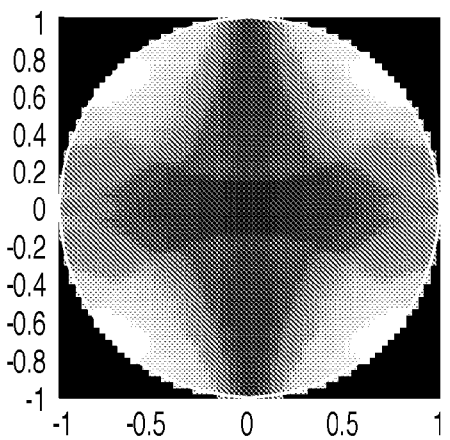
Figure 27F:
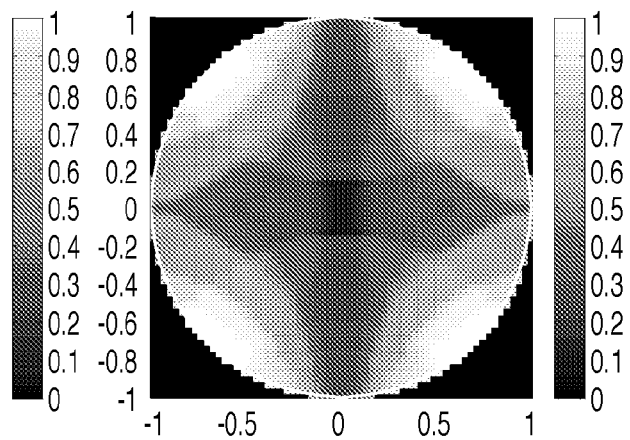

This enables to obtain an effective source shown in FIG. 27E as an effective source suited to the virtual map shown in FIG. 27C, and an effective source shown in FIG. 27F as an effective source suited to the virtual map shown in FIG. 27D.

Next, an aerial image formed on the image plane of the projection optical system is calculated based on the virtual map shown in FIG. 27C and the effective source shown in FIG. 27E. The intensity distribution is calculated using not the effective source shown in FIG. 27E itself but a virtual light source as shown in FIG. 28A which is obtained by extracting regions with high intensities (that is, with intensity values equal to or larger than a threshold) from the effective source shown in FIG. 27E. In addition, a pupil filter which forms a transmittance distribution, according to which it transmits light beams from the light source shown in FIG. 28A, on the pupil plane is assumed, as shown in FIG. 28B. The intensity distribution formed on the image plane is calculated using the virtual light source, virtual map, and pupil filter. Using the pupil filter allows to improve the contrast of the intensity distribution. An intensity distribution as shown in FIG. 28C is calculated.

Figure 28C:
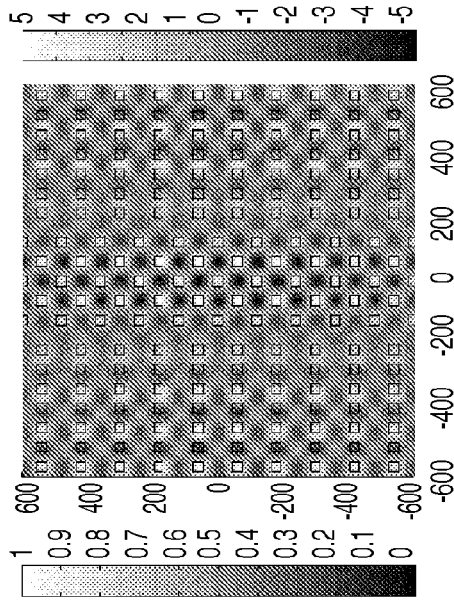
FIGS. 28A to 28F are views for explaining a mask data generation in the fourth embodiment.
Figure 28B:
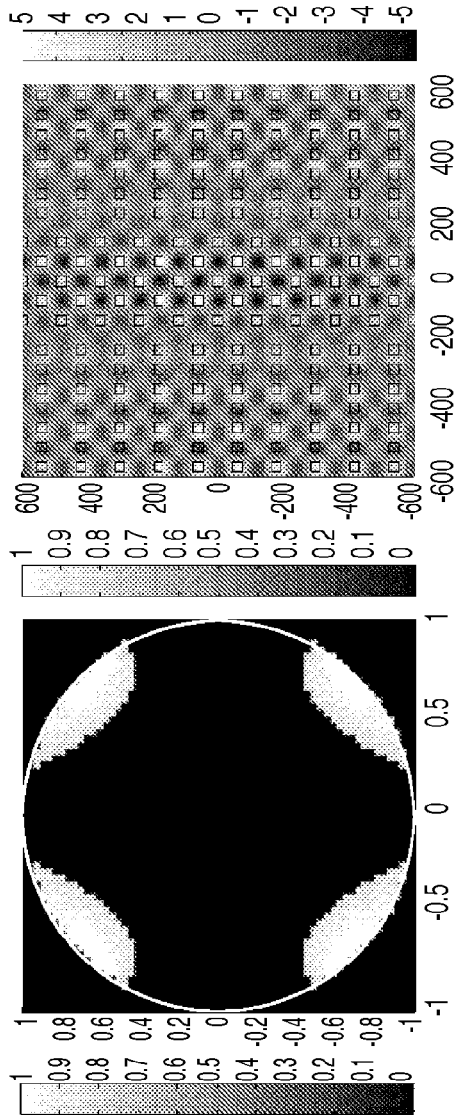
Figure 28A:
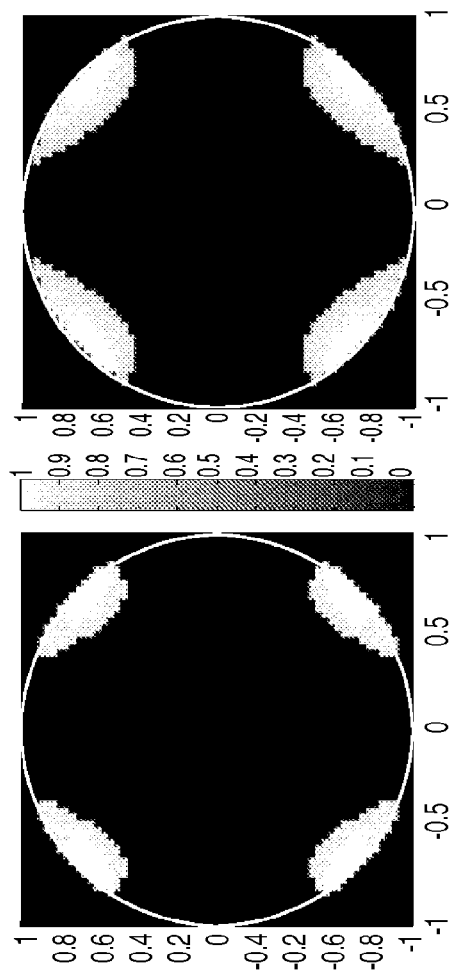
Figure 28F:
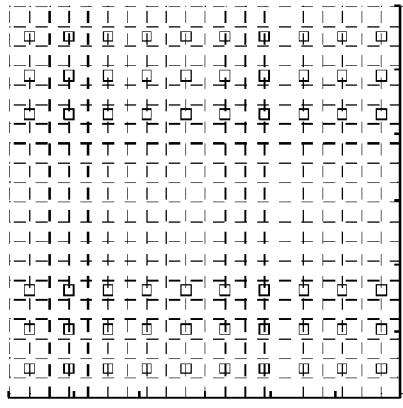
Figure 28E:
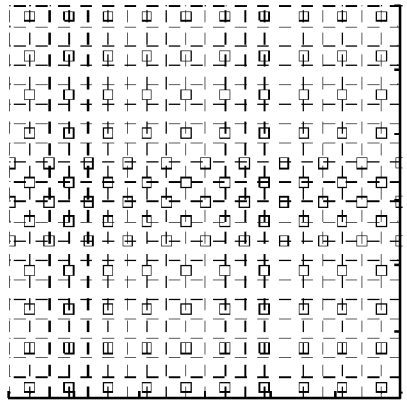
Figure 28D:
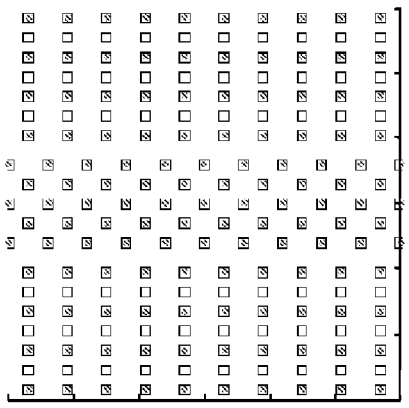

Next, in the intensity distribution shown in FIG. 28C, peak positions where the intensity has peaks are specified. Pattern elements (first pattern elements) which include the specified peak positions when a temporary target pattern corresponding to the target pattern shown in FIG. 27A is projected onto the image plane are extracted from the plurality of pattern elements (FIG. 28F). In FIG. 28F, the peak positions indicated by circles are superimposed on the plurality of pattern elements of the temporary target pattern projected onto the image plane. The data of a pattern including thus extracted first pattern elements (that is, a pattern suited to the virtual light source shown in FIG. 28A) is generated as the mask data of one of a plurality of masks for use in multiple exposure (FIG. 28E).

Note that the pattern as shown in FIG. 28F is obtained by excluding the first pattern elements from the target pattern shown in FIG. 27A.

When an intensity distribution formed on the image plane of the projection optical system is calculated in accordance with the same procedure as described above based on the virtual map shown in FIG. 27D and the effective source shown in FIG. 27F described above, ideally, the pattern elements shown in FIG. 28F are expected to be obtained. However, there is no guarantee that the pattern elements are divided into two patterns unless the target pattern has a single pitch, as described above.

Figures 29A, 29B, 29C:
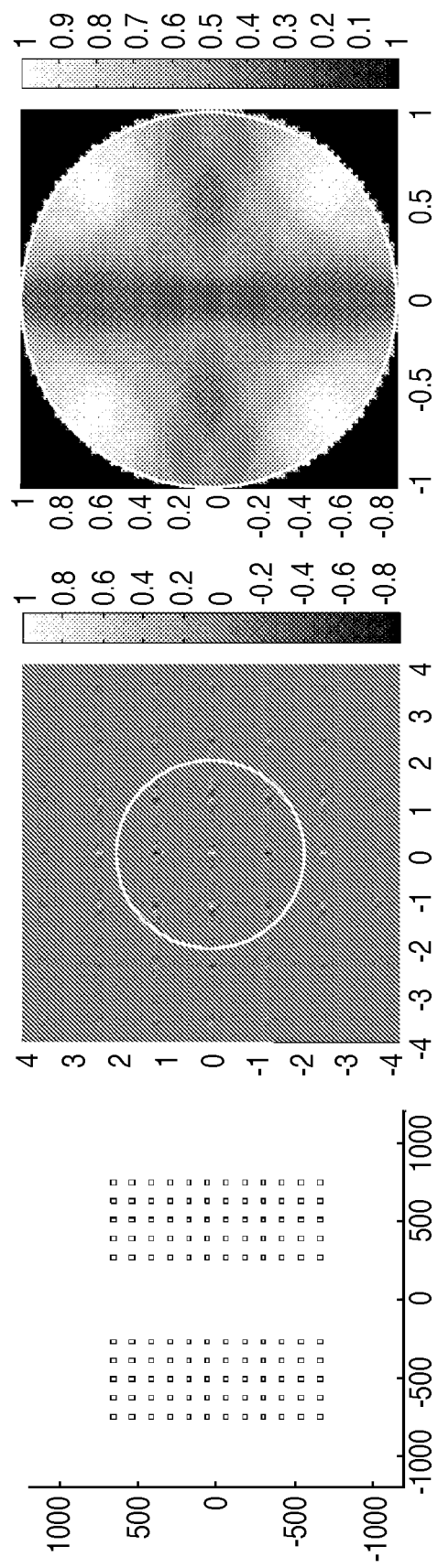
FIGS. 29A to 29C are views for explaining a mask data generation in the fourth embodiment.

In this case, a pattern including second pattern elements obtained by excluding the first pattern elements from the target pattern shown in FIG. 27A is set as a new temporary target pattern, as shown in FIG. 29A. When the target pattern shown in FIG. 29A is Fourier-transformed, a frequency map as shown in FIG. 29B is generated. Referring to FIG. 29B, concerning the X- and Y directions, all 1st-order diffracted lights are located inside the circle twice as large as the pupil radius of the projection optical system. Hence, the target pattern shown in FIG. 29A should be resolvable by one exposure. It is therefore unnecessary to create a virtual map from the frequency map shown in FIG. 28B (that is, divide the frequency map shown in FIG. 29B).

When the shape of the pupil of the projection optical system is convoluted to diffracted lights having frequency components with the same sign on the frequency map shown in FIG. 29B, an effective source as shown in FIG. 29C is obtained. As described above, an intensity distribution is calculated by setting a virtual light source and a pupil filter from the effective source shown in FIG. 29C, and first pattern elements are extracted, thereby extracting pattern elements that match the target pattern shown in FIG. 29A. When the first pattern elements are excluded from the target pattern shown in FIG. 29A, the number of remaining pattern elements (that is, second pattern elements) is zero. The process of generating mask data is thus ended.

Figure 22:
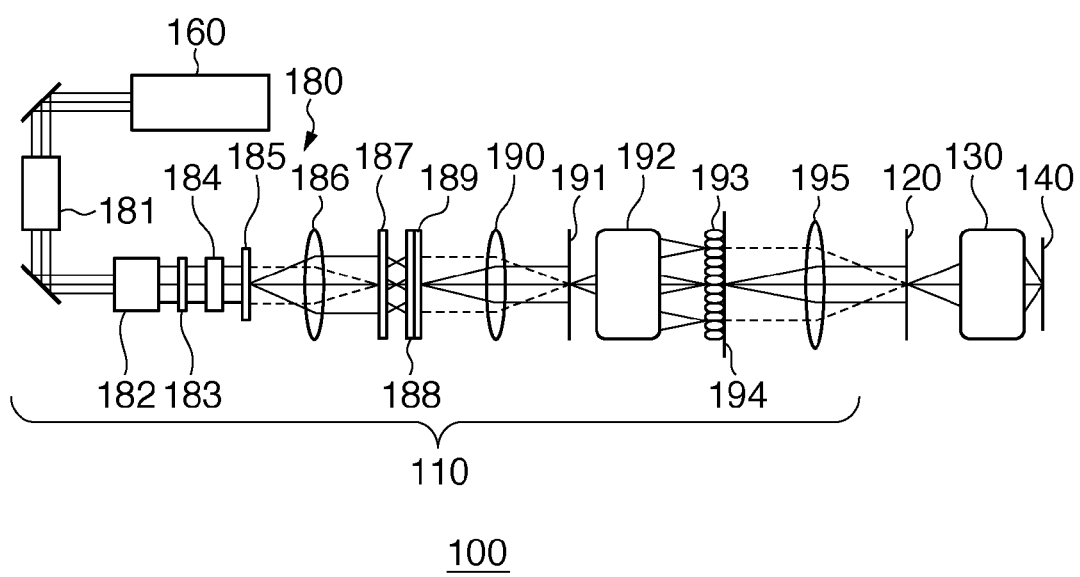
FIG. 22 is a schematic block diagram showing the arrangement of an exposure apparatus according to one aspect of the present invention.

An exposure apparatus 100 will be described next with reference to FIG. 22. FIG. 22 is a schematic block diagram showing the arrangement of the exposure apparatus 100. In this embodiment, the exposure apparatus 100 is a projection exposure apparatus which transfers the pattern of a mask 120 onto a wafer 140 by exposure using the step & scan scheme. However, the exposure apparatus 100 can also adopt the step & repeat scheme or another exposure scheme.

The exposure apparatus 100 includes an illumination device 110, a reticle stage (not shown) which supports the mask 120, a projection optical system 130, and a wafer stage (not shown) which supports the wafer 140, as shown in FIG. 22.

The illumination device 110 illuminates the mask 120 on which a circuit pattern to be transferred is formed, and includes a light source 160 and illumination optical system 180. The light source 160 is, for example, an excimer laser such as an ArF excimer laser with a wavelength of about 193 nm, or a KrF excimer laser with a wavelength of about 248 nm. However, the light source 160 is not limited to an excimer laser, and an $F_2$ laser with a wavelength of about 157 nm or a mercury lamp in a narrow wavelength range may be used. The illumination optical system 180 illuminates the mask 120 with light from the light source 160. Note that in this embodiment, the illumination optical system 180 forms effective sources corresponding to a plurality of mask data, respectively, generated by executing the above-mentioned mask data generating program.

The illumination optical system 180 includes a routing optical system 181, beam shaping optical system 182, polarization control unit 183, phase control unit 184, exit angle control optical element 185, relay optical system 186, and multibeam generation unit 187. The illumination optical system 180 also includes a polarization state adjusting unit 188, computer generated hologram 189, relay optical system 190, aperture 191, zoom optical system 192, multibeam generation unit 193, aperture stop 194, and irradiation unit 195.

The routing optical system 181 deflects light from the light source 160 toward the beam shaping optical system 182. The beam shaping optical system 182 changes the aspect ratio of the dimensions of the cross-sectional shape of light from the light source 160 into a desired value (for example, converts the cross-sectional shape from a rectangle to a square) to shape the cross-sectional shape of the light from the light source 160 into a desired shape. The beam shaping optical system 182 forms a light beam with a size and an angle of divergence which are necessary to illuminate the multibeam generation unit 187.

The polarization control unit 183 includes, for example, a linear polarizer, and has a function of eliminating unwanted polarized components. Light from the light source 160 can be efficiently converted into desired linearly polarized light by minimizing polarized components eliminated (shielded) by the polarization control unit 183.

The phase control unit 184 generates a phase difference of λ/4 in the light linearly polarized by the polarization control unit 183 to convert it into circularly polarized light.

The exit angle control optical element 185 includes, for example, an optical integrator (for example, a fiber bundle or a fly-eye lens including a plurality of microlenses), and outputs light at a predetermined angle of divergence.

The relay optical system 186 focuses the light emerging from the exit angle control optical element 185 on the multibeam generation unit 187. The exit surface of the exit angle control optical element 185 and the incident surface of the multibeam generation unit 187 have a Fourier transform relationship between them (serve as an object plane and a pupil plane, respectively, or as a pupil plane and an image plane, respectively) via the relay optical system 186.

The multibeam generation unit 187 includes an optical integrator (for example, a fiber bundle or a fly-eye lens including a plurality of microlenses) for uniformly illuminating the polarization state adjusting unit 188 and computer generated hologram 189. The exit surface of the multibeam generation unit 187 forms a light source surface including a plurality of point sources. The light emerging from the multibeam generation unit 187 enters the polarization state adjusting unit 188 as circularly polarized light.

The polarization state adjusting unit 188 generates a phase difference of $\lambda/4$ in the light circularly polarized by the phase control unit 184 to convert it into linearly polarized light with a desired polarization direction. The light emerging from the polarization state adjusting unit 188 impinges on the computer generated hologram 189 as linearly polarized light.

The computer generated hologram 189 forms a desired light intensity distribution at the position of the aperture 191 via the relay optical system 190. The computer generated hologram 189 forms an effective source, as described above, in correspondence with mask data (that is, a mask pattern). The computer generated hologram 189 can also form, for example, annular illumination. A plurality of computer generated holograms 189 which form these different effective sources are placed on a switching unit such as a turret. Various kinds of effective sources can be realized by inserting a computer generated hologram 189 corresponding to the effective source data generated by the above-mentioned processing apparatus 1 into the optical path of the illumination optical system 180.

The aperture 191 has a function of passing only a light intensity distribution formed by the computer generated hologram 189. The computer generated hologram 189 and aperture 191 are placed to serve as Fourier transform planes.

The zoom optical system 192 enlarges a light intensity distribution formed by the computer generated hologram 189 at a predetermined magnification, and projects it onto the multibeam generation unit 193.

The multibeam generation unit 193 is placed on the pupil plane of the illumination optical system 180, and forms a light source image (effective source distribution) corresponding to the light intensity distribution formed at the position of the aperture 191 on the exit surface. In this embodiment, the multibeam generation unit 193 includes an optical integrator such as a fly-eye lens or a cylindrical lens array. Note that the aperture stop 194 is placed near the exit surface of the multibeam generation unit 193.

The irradiation unit 195 includes, for example, a condenser optical system, and illuminates the mask 120 with an effective source distribution formed on the exit surface of the multibeam generation unit 193.

The mask 120 is created based on the mask data generated by the above-mentioned processing apparatus 1, and has a circuit pattern to be transferred (main pattern) and auxiliary patterns. The mask 120 is supported and driven by a mask stage (not shown). Light diffracted by the mask 120 is projected onto the wafer 140 via the projection optical system 130. Since the exposure apparatus 100 is of the step & scan scheme, it transfers the pattern of the mask 120 onto the wafer 140 by scanning the mask 120 and wafer 140. Note that the mask 120 includes a plurality of masks for use in multiple exposure.

Figure 23:
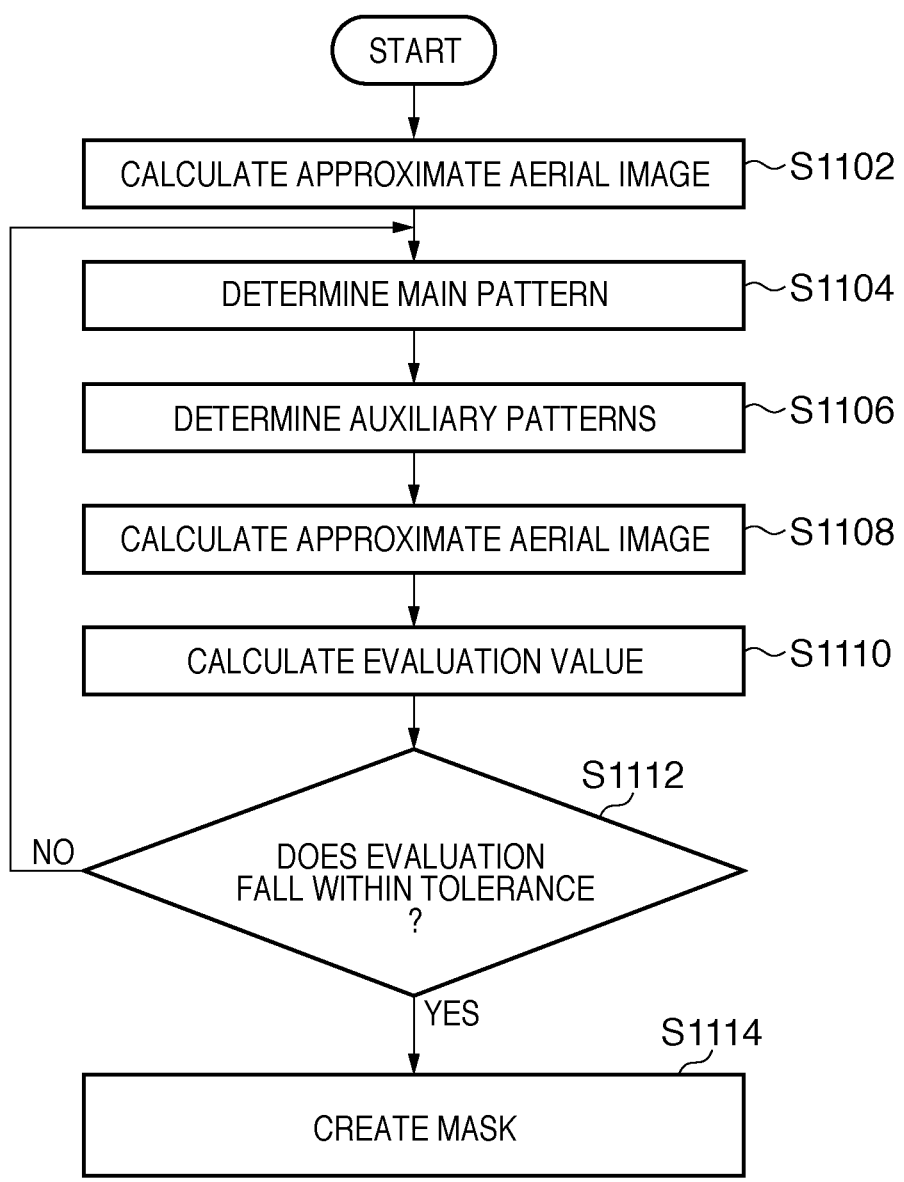
FIG. 23 is a flowchart for explaining a mask creating method according to one aspect of the present invention.

A method of creating a mask 120 will be explained herein with reference to FIG. 23. In step S1102, an approximate aerial image (that is, an approximate aerial image of a target pattern) is calculated based on, for example, 2D-TCC using the mask data generated by the processing apparatus 1 as a target pattern.

In step S1104, a main pattern is determined based on the approximate aerial image calculated in step S1102. More specifically, a two-dimensional image in a cross-section of the approximate aerial image is extracted based on a preset reference slice value. A main pattern is determined by changing its shape based on the extracted two-dimensional image.

In step S1106, auxiliary patterns are determined based on the approximate aerial image calculated in step S1102. More specifically, the positions at which auxiliary patterns are to be inserted (auxiliary pattern insertion positions) are extracted from the approximate aerial image calculated in step S1102. The auxiliary pattern insertion positions are peak positions where the intensity has peaks (local maximum values or local minimum values) in regions which have slice values less than a reference slice value and do not overlap the main pattern (that is, regions other than the region to which the target pattern is projected). The sizes of the auxiliary patterns are determined based on the intensities at the peak positions, and the auxiliary patterns with the determined sizes are inserted at the auxiliary pattern insertion positions.

In step S1108, an approximate aerial image (that is, an approximate aerial image of a pattern including the main pattern and auxiliary patterns) is calculated based on the main pattern determined in step S1104 and the auxiliary patterns determined in step S1106.

In step S1110, an evaluation value (a parameter for use in evaluation) for evaluating the approximate aerial image calculated in step S1108 is calculated. The pattern line width, the pattern length, the NILS (Normalized Image Log Slope), or the intensity peak value, for example, is calculated as an evaluation value.

In step S1112, it is determined whether the evaluation value calculated in step S1110 falls within a tolerance. If the evaluation value falls outside the tolerance, the process returns to step S1104, in which a main pattern is determined based on the evaluation value. In contrast, if the evaluation value falls within the tolerance, the process advances to step S1114, in which a mask 120 is created based on the main pattern determined in step S1104, and the auxiliary patterns determined in step S1106.

The projection optical system 130 projects the pattern of the mask 120 onto the wafer 140. The projection optical system 130 can be a dioptric system, a catadioptric system, or a catoptric system.

The wafer 140 is a substrate onto which the pattern of the mask 120 is projected (transferred), and is supported and driven by the wafer stage (not shown). However, a glass plate or another substrate can also be used in place of the wafer 140. The wafer 140 is coated with a photoresist.

In exposure, light emitted by the light source 160 illuminates the mask 120 by the illumination optical system 180. The light which bears the information of the pattern of the mask 120 forms an image on the wafer 140 by the projection optical system 130. At this time, the exposure apparatus 100 performs multiple exposure using the mask 120 created based on the mask data generated by the above-mentioned processing apparatus 1. Also, the mask 120 is illuminated with an effective source corresponding to the mask data. Hence, the exposure apparatus 100 can provide high-quality devices (for example, a semiconductor device, an LCD device, an image sensing device (for example, a CCD), and a thin film magnetic head) with a high throughput and good economical efficiency. These devices are fabricated by a step of exposing a substrate (for example, a wafer or a glass plate) coated with a photoresist (photosensitive agent) using the exposure apparatus 100, a step of developing the exposed substrate (photosensitive agent), and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-186149 filed on Aug. 10, 2009 and 2010-159167 filed on Jul. 13, 2010, which are hereby incorporated by reference herein in their entirety.

What is claimed is:

1. A method of manufacturing a plurality of originals for use in multiple exposures, in which a single-layer pattern is formed on a substrate by exposing the substrate a plurality of times, in an exposure apparatus including an illumination optical system which illuminates an original, and a projection optical system which projects a pattern of the original onto a substrate, the method comprising:

generating data of patterns of the plurality of originals by a computer, and forming a pattern on the plurality of originals based on the generated data, wherein the generating comprising:

a first step of generating a map by sequentially defining as a pattern element of interest a plurality of pattern elements of a temporary target pattern corresponding to a pattern to be formed on the substrate, and mapping positions of pattern elements other than the pattern element of interest relative to the pattern element of interest using a position of the pattern element of interest as an origin;

a second step of selecting pattern elements with a periodicity from the map generated in the first step, and determining an effective source in a pupil plane of the projection optical system corresponding to an array pattern of the selected pattern elements among a plurality of predetermined effective sources;

a third step of postulating a pupil filter which transmits light in a region with an intensity value larger than a predetermined value in the effective source determined in the second step, on a pupil plane of the projection optical system;

a fourth step of calculating an intensity distribution formed on an image plane of the projection optical system by the light having passed through the pupil filter, postulated in the third step, when the effective source determined in the second step illuminates the plurality of pattern elements of the temporary target pattern in the first step placed on an object plane of the projection optical system;

a fifth step of specifying a peak position where an intensity has a peak in the intensity distribution calculated in the fourth step;

a sixth step of extracting a first pattern element corresponding to the peak position, specified in the fifth step, from the plurality of pattern elements of the temporary target pattern in the fourth step; and a seventh step of generating data on a pattern including the first pattern element extracted in the sixth step as data on a pattern of one original of the plurality of originals, wherein a cycle including the first step to the seventh step is repeated using a pattern including a second pattern element obtained by excluding the first pattern element extracted in the sixth step from the plurality of pattern elements of the temporary target pattern in the fourth step as a new temporary target pattern, and the repetition is ended in a round of the cycle, in which a number of the second pattern element becomes zero.

2. The method according to claim 1, wherein in the second step, pattern elements are selected from the map while excluding a pattern element which has a non-resolvable period determined based on a wavelength of the light from the light source, and a numerical aperture of the projection optical system.

3. The method according to claim 1, wherein in the second step, seven pattern elements are selected from the map, and an effective source which causes three light beams among light beams diffracted by the seven pattern elements, respectively, to pass through a pupil of the projection optical system is determined.

4. The method according to claim 3, wherein in the second step, the seven pattern elements are selected from pattern elements which fall within a range of dimensions shorter than 1.5 times a minimum resolvable pitch determined based on a wavelength of the light from the light source, and a numerical aperture of the projection optical system, and are present at the origin and within a range of $\pm 10°$ with respect to straight lines which connect the origin to six pattern elements.

5. The method according to claim 1, wherein in the second step, five pattern elements are selected from the map, and an effective source which causes four light beams among light beams diffracted by the five pattern elements, respectively, to pass through a pupil of the projection optical system is determined.

6. The method according to claim 5, wherein in the second step, the five pattern elements are selected from pattern elements which fall within a range of dimensions shorter than 1.5 times a minimum resolvable pitch determined based on a wavelength of the light from the light source, and a numerical aperture of the projection optical system, and are present at the origin and within a range of $\pm 10°$ with respect to straight lines which connect the origin to four pattern elements.

7. An exposure method comprising:

illuminating a plurality of originals manufactured by an original manufacturing method defined in claim 1; and projecting images of patterns of the plurality of originals onto a substrate via a projection optical system.

8. A non-transitory storage medium storing, in a computer-readable form, a program for generating, by a computer, data of patterns of a plurality of originals in a method of manufacturing the plurality of originals for use in multiple exposures, in which a single-layer pattern is formed on a substrate by exposing the substrate a plurality of times, in an exposure apparatus including an illumination optical system which illuminates an original, and a projection optical system which projects a pattern of the original onto a substrate, the method comprising:

generating data of patterns of the plurality of originals by a computer, and forming a pattern on the plurality of originals based on the generated data, the program causing the computer to execute:

a first step of generating a map by sequentially defining as a pattern element of interest a plurality of pattern elements of a temporary target pattern corresponding to a pattern to be formed on the substrate, and mapping positions of pattern elements other than the pattern element of interest relative to the pattern element of interest using a position of the pattern element of interest as an origin;

a second step of selecting pattern elements with a periodicity from the map generated in the first step, and determining an effective source in a pupil plane of the projection optical system corresponding to an array pattern of the selected pattern elements among a plurality of predetermined effective sources;

a third step of postulating a pupil filter which transmits light in a region with an intensity value larger than a predetermined value in the effective source determined in the second step, on a pupil plane of the projection optical system;

a fourth step of calculating an intensity distribution formed on an image plane of the projection optical system by the light having passed through the pupil filter, postulated in the third step, when the effective source determined in the second step illuminates the plurality of pattern elements of the temporary target pattern in the first step placed on an object plane of the projection optical system;

a fifth step of specifying a peak position where an intensity has a peak in the intensity distribution calculated in the fourth step;

a sixth step of extracting a first pattern element corresponding to the peak position, specified in the fifth step, from the plurality of pattern elements of the temporary target pattern in the fourth step; and a seventh step of generating data on a pattern including the first pattern element extracted in the sixth step as data on a pattern of one original of the plurality of originals, wherein a cycle including the first step to the seventh step is repeated using a pattern including a second pattern element obtained by excluding the first pattern element extracted in the sixth step from the plurality of pattern elements of the temporary target pattern in the fourth step as a new temporary target pattern, and the repetition is ended in a round of the cycle, in which a number of second pattern element becomes zero.

* * * * *